US012660354B2

(12) United States Patent
Jang

(10) Patent No.: US 12,660,354 B2
(45) Date of Patent: Jun. 16, 2026

(54) IMAGE SENSING DEVICE

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 94 days.

(21) Appl. No.: 18/617,425

(22) Filed: Mar. 26, 2024

(65) Prior Publication Data

US 2024/0379708 A1 Nov. 14, 2024

(30) Foreign Application Priority Data

May 9, 2023 (KR) ......................... 10-2023-0059912

(51) Int. Cl.
H04N 25/705 (2023.01)
G01S 7/4863 (2020.01)
G01S 17/894 (2020.01)
H10F 39/00 (2025.01)

(52) U.S. Cl.
CPC .......... H10F 39/807 (2025.01); G01S 7/4863 (2013.01); G01S 17/894 (2020.01); H04N 25/705 (2023.01)

(58) Field of Classification Search
CPC .................................................... H04N 25/705
See application file for complete search history.

(56) References Cited

U.S. PATENT DOCUMENTS

2022/0102397 A1 3/2022 Wu et al.
2022/0190008 A1* 6/2022 Jang ..................... H10F 39/807

FOREIGN PATENT DOCUMENTS

KR 20200043545 A 4/2020
KR 20210072003 A 6/2021
KR 20220086076 A 6/2022

* cited by examiner

*Primary Examiner* — James M Hannett
(74) *Attorney, Agent, or Firm* — Perkins Coie LLP

(57) ABSTRACT

An image sensing device includes a plurality of unit pixels. Each of the plurality of unit pixels includes a photoelectric conversion region formed in a substrate and configured to generate photocharges from incident light, a control region located on one surface of the substrate and configured to correspond to each of the plurality of unit pixels, a detection region configured to capture the photocharges moving by a hole current, an isolation region configured to surround the photoelectric conversion region, and a passivation region disposed on the other surface opposite to the one surface of the substrate, wherein the hole current flows between control region and the passivation region.

19 Claims, 10 Drawing Sheets

IMAGE SENSING DEVICE

PRIORITY CLAIM AND CROSS-REFERENCE TO RELATED APPLICATION

This patent document claims the priority and benefits of Korean patent application No. 10-2023-0059912, filed on May 9, 2023, the disclosure of which is incorporated by reference in its entirety as part of the disclosure of this patent document.

TECHNICAL FIELD

The technology and implementations disclosed in this patent document generally relate to an image sensing device, and more particularly to an image sensing device for measuring a distance to a target object.

BACKGROUND

An image sensing device is a device for capturing and converting light of optical images into electrical signals for displaying the captured images and for further processing of the captured images. With the recent development of various industries and sectors, including computer and communication industries, generate various demands for high-quality, high-performance image sensing devices has been rapidly increasing in various electronic devices and systems, such as smartphones, digital cameras, game consoles, Internet of Things (IoT), robots, surveillance cameras, medical micro-cameras, etc.

One very common type of image sensing devices is a charge coupled device (CCD) image sensing device, which has dominated the field of image sensors for a long time. Another common type of image sensing device is a complementary metal oxide semiconductor (CMOS) image sensing device. CCD image sensing devices have advantages CMOS image sensing devices in terms of noise characteristics and image quality. However, CMOS image sensing devices are now widely used due to certain advantages over the CCD counterparts, including, e.g., ease of use and wide range of scanning schemes.

In addition, CMOS image sensing devices and signal processing circuitry can be integrated into a single chip, making it possible to miniaturize electronic devices while achieving lower power consumption and lower production costs. Such characteristics of CMOS image sensing devices make these sensors better suited for implementations in mobile devices.

SUMMARY

Various embodiments of the disclosed technology relate to an image sensing device having a structure optimized for distinguishing detection signals between adjacent unit pixels.

In an embodiment of the disclosed technology, an image sensing device may include a plurality of unit pixels. Each of the plurality of unit pixels may include: a photoelectric conversion region formed in a substrate and configured to generate photocharges from incident light; a control region located on one surface of the substrate and configured to correspond to each of the plurality of unit pixels; a detection region configured to capture the photocharges moving by a hole current; an isolation region configured to surround the photoelectric conversion region; and a passivation region disposed on the other surface opposite to the one surface of the substrate, wherein the hole current flows between the control region and the passivation region.

In an embodiment of the disclosed technology, an image sensing device may include: a substrate; and a plurality of unit pixels located in the substrate and configured to generate pixel signals by converting incident light from a target object into photocharge to indicate an image of the target object carried by the incident light and distance information between the image sensing device and the target object in response to a demodulation control signal for generating a current in the substrate. Each of the plurality of unit pixels may include: a photoelectric conversion region formed in the substrate and configured to generate the photocharge by converting the incident light; a control region disposed adjacent to the photoelectric conversion region in the substrate and extending to a first surface of the substrate and configured to receive the demodulation control signal; a detection region disposed adjacent to the photoelectric conversion region and the control region in the substrate and configured to capture the photocharge moving by the generated current; an isolation region structured to surround the photoelectric conversion region, the control region, and the detection region; and a passivation region disposed on a second surface of the substrate opposite to the first surface of the substrate, wherein the control region and the passivation region are arranged such that the generated current flows between the control region and the passivation region.

In some implementations, the plurality of unit pixels may be arranged in in rows and columns in a pixel array, and the isolation region surrounding the photoelectric conversion region, the control region, and the detection region is configured to block the photocharges from moving between adjacent unit pixels arranged in the pixel array.

In some implementations, the substrate and the unit pixels are configured to generate holes that form the generated current.

In some implementations, the demodulation control signal switches between an activation voltage and a deactivation voltage, wherein the activation voltage activates the detection region to generate the generated current, and the deactivation voltage deactivates the detection region.

In some implementations, the demodulation control signal is one of a first demodulation control signal, a second demodulation control signal, a third demodulation control signal, or a fourth demodulation control signal. The first demodulation control signal may have a phase difference of 90 degrees with respect to the second demodulation control signal. The second demodulation control signal may have a phase difference of 90 degrees with respect to the third demodulation control signal. The third demodulation control signal may have a phase difference of 90 degrees with respect to the fourth demodulation control signal. The third demodulation control signal may have a phase difference of 90 degrees with the fourth demodulation control signal. The fourth demodulation control signal may have a phase difference of 90 degrees with respect to the first demodulation control signal.

In some implementations, the plurality of unit pixels includes four adjacent unit pixels arranged in a matrix array having two rows and two columns, and the demodulation control signals respectively applied to the four unit pixels are the first, second, third, and fourth demodulation control signals, respectively.

In some implementations, the detection region may be configured to surround the control region, and the isolation region may be configured to surround the detection region.

In some implementations, the passivation region may be configured to receive a ground voltage as an input.

In some implementations, each of the plurality of unit pixels may include a transistor region including transistors for processing the pixel signal received from the detection region.

In some implementations, the isolation region is configured to isolate the photoelectric conversion region from the transistor region.

In some implementations, each of the plurality of unit pixels may include a well region located on the first surface of the substrate and adjacent to the isolation region.

In some implementations, the well region may be configured to surround the isolation region.

In some implementations, the well region may be configured to receive a ground voltage as an input.

In some implementations, the isolation region may be formed to extend from the first surface of the substrate to the second surface opposite to the first surface of the substrate.

In some implementations, the isolation region may include a reflection layer configured to reflect the incident light, and an insulation layer in contact with the reflection layer.

In another embodiment of the disclosed technology, an image sensing device may include a plurality of unit pixels. Each of the plurality of unit pixels may include a light reception region configured to receive incident light; and a transistor region configured to process a pixel signal generated from the light reception region. The light reception region may include a control region configured to correspond to each of the plurality of unit pixels and configured to generate a hole current; a detection region configured to capture photocharges moving by the hole current and configured to output the pixel signal corresponding to the photocharges; and an isolation region configured to isolate the light reception region from another adjacent light reception region or the transistor region.

In another embodiment of the disclosed technology, an image sensing device may include a plurality of unit pixels configured to generate pixel signals by converting incident light from a target object into photocharge to indicate an image of the target object and a distance between the image sensing device and the target object in response to a demodulation control signal for generating a current. Each of the plurality of unit pixels may include: a light reception region configured to receive incident light and generate the pixel signal corresponding to the incident light; and a transistor region configured to process the pixel signal generated by the light reception region, wherein the light reception region includes: a control region configured to generate the generated current; a detection region configured to capture photocharge moving by the generated current and configured to output the pixel signal corresponding to the photocharge; and an isolation region structured to isolate the light reception region from another adjacent light reception region or the transistor region.

In some implementations, the control region may be configured to receive the demodulation control signal as an input.

In some implementations, the image sensing device may further include a passivation region configured to receive a ground voltage as an input to direct the generated current to flow between the control region and the passivation region.

In some implementations, the unit pixels may be structured so that the generated current is generated by holes that are generated upon receiving the demodulation control signal by the control region.

In some implementations, the demodulation control signal may switch between an activation voltage and a deactivation voltage, wherein the activation voltage activates the detection region to generate the generated current, and the deactivation voltage deactivates the detection region by terminating the generated current.

It is to be understood that both the foregoing general description and the following detailed description of the disclosed technology are illustrative and explanatory and are intended to provide further explanation of the disclosure as claimed.

DETAILED DESCRIPTION

Figure 1:
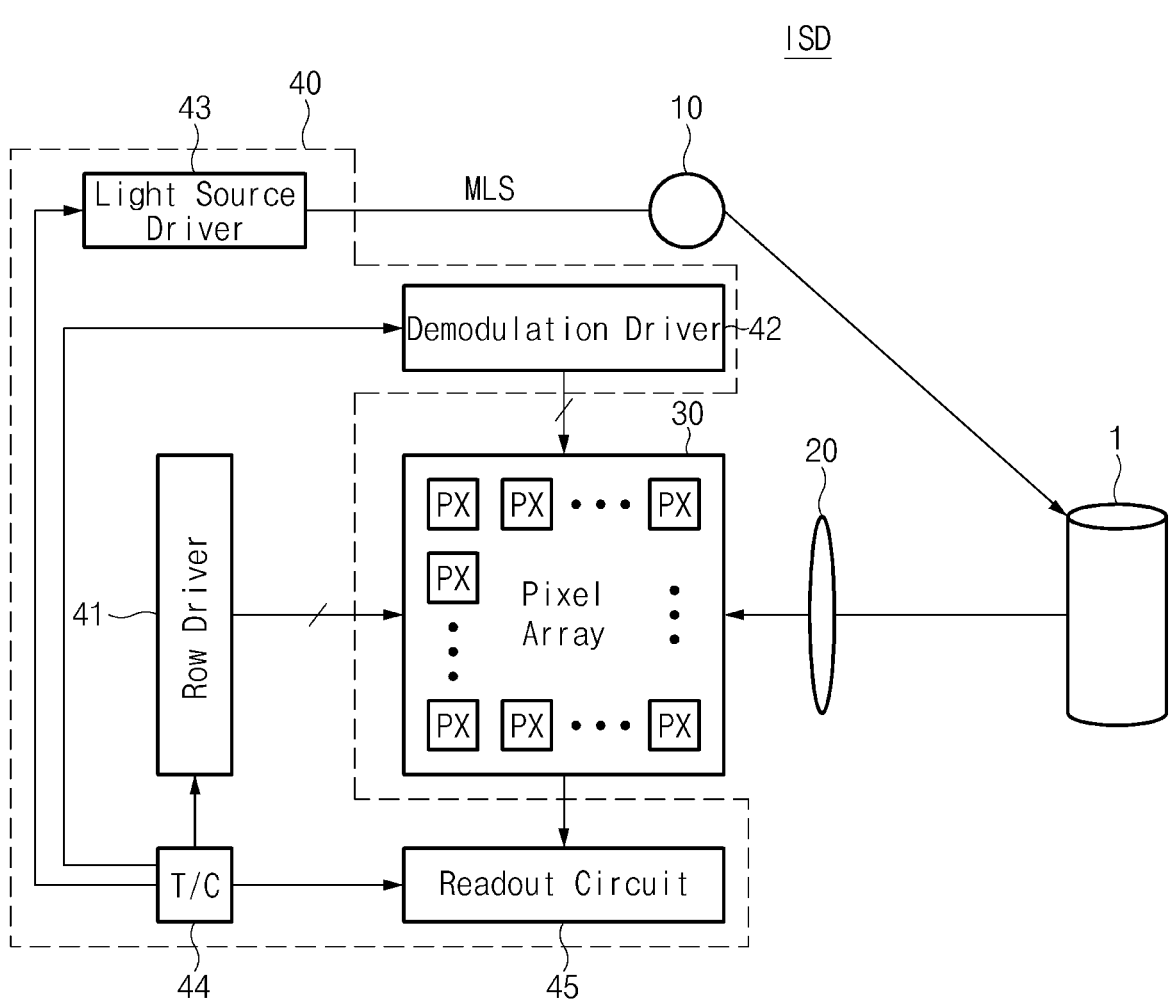
FIG. 1 is a block diagram illustrating an example of an image sensing device based on some implementations of the disclosed technology.

This patent document provides implementations and examples of an image sensing device for measuring a distance to a target object by addressing one or more technical or engineering issues in some image sensing device designs. Some implementations of the disclosed technology relate to an image sensing device that includes a structure for distinguishing detection signals corresponding to a unit pixel from detection signals corresponding to adjacent unit pixels. The disclosed technology can be implemented in some embodiments to provide an image sensing device that includes an isolation structure formed to surround a photoelectric conversion region in a unit pixel, thereby avoiding or minimizing potential signal interferences between adjacent unit pixels and leakage currents. The disclosed technology can be implemented in some embodiments to provide an image sensing device including unit pixels that form a vertical electric field in the photoelectric conversion region, thereby improving photocharge transfer efficiency.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Depth measurement methods for measuring range and depth (e.g., a distance to a target object) using image sensing devices are used in various devices, such as security devices, medical devices, automobiles, game consoles, virtual reality (VR)/augmented reality (AR) devices, mobile devices, etc. Examples of such depth measurement methods include a triangulation method, a time of flight (TOF) method, and an interferometry method. Among these depth measurement methods, the TOF method is being widely used because of its wide range of applications, a high processing speed, and a cost efficiency.

The TOF method may be mainly classified into a direct method and an indirect method, depending on whether a round-trip time of light or a phase difference of light is used to determine the distance between a TOF sensor and an object.

The direct method is used to measure a longer distance and thus is widely used in automobiles. The indirect method is used to measure a shorter distance and thus is used for a game machine or a mobile camera that is used at a shorter distance and requires a faster processing speed. The indirect TOF sensor can be implemented using a simple circuit at a low cost.

In some implementations, an indirect TOF sensor may utilize a current-assisted photonic demodulator (CAPD) method that detects electrons that have been generated by pixels in a substrate using a majority current acquired by applying a voltage to the substrate to utilize a voltage difference between electric fields. By using the majority current, the CAPD method can more quickly detect electrons and can detect some electrons formed at a deep depth in the substrate.

FIG. 1 is a block diagram illustrating an example of an image sensing device ISD based on some implementations of the disclosed technology.

Referring to FIG. 1, the image sensing device ISD may measure the distance between the image sensing device ISD and a target object 1 using the TOF method. In some implementations, the image sensing device ISD may include a light source 10, a lens module 20, a pixel array 30, and a control circuit 40.

In some implementations, the light source 10 may emit light to a target object 1 upon receiving a light modulation signal MLS from the control circuit 40. The light source 10 may be a laser diode (LD) or a light emitting diode (LED) for emitting light (e.g., near infrared (NIR) light, infrared (IR) light or visible light) having a specific wavelength band. Examples of the light source 10 may include a near infrared laser (NIR), a point light source, a monochromatic light source combined with a white lamp or a monochromator, and a combination of laser sources. For example, the light source 10 may emit infrared light having a wavelength of 800 nm to 1000 nm. Light emitted from the light source 10 may include light rays that are modulated by a predetermined frequency. Although FIG. 1 shows only one light source 10 for convenience of description, the disclosed technology is not limited thereto, and a plurality of light sources may also be arranged in the vicinity of the lens module 20.

The lens module 20 may collect light reflected from the target object 1 and focus the collected light onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to focus light to an optical axis.

The pixel array 30 may include a plurality of unit pixels (PXs) consecutively arranged in rows and columns in a two-dimensional (2D) matrix array.

The unit pixels (PXs) in the pixel array 30 may be formed over a semiconductor substrate. Each unit pixel (PX) may convert incident light received through the lens module 20 into an electrical signal corresponding to the amount of incident light rays or the intensity of incident light, and may thus output a pixel signal using the electrical signal. The pixel signals from unit pixels (PXs) in the pixel array 30 can be used to capture the image information of an image carried in the incident light that is received and detected by unit pixels (PXs) in the pixel array 30 for the imaging operation of the image sensing device ISD and can also be used to obtain the distance information based on a phase sensing mechanism with detection of the modulated light from the one or more light sources 10 as part of the incident light received by the pixel array 30 to provide depth information corresponding to each unit pixel as explained in detail below.

Each unit pixel (PX) may be operated as a current-assisted photonic demodulator (CAPD) pixel. Examples of implementations of the structure and operations of each unit pixel (PX) are described with reference to the drawings FIGS. 2 through 10.

The control circuit 40 may emit light to the target object 1 by controlling the light source 10. Upon receipt of the reflected light from the target object 1, the control block 40 may process each pixel signal corresponding to light reflected from the target object 1 by activating selected unit pixels (PXs) of the pixel array 30, and may measure the distance between the image sensing device ISD and the surface of the target object 1 using the processed pixel signal. In addition, the unit pixels (PXs) of the pixel array 30 detect incident light from the target object 1 to capture the image of the target object 1.

The control circuit 40 may include a row driver 41, a demodulation driver 42, a light source driver 43, a timing controller 44, and a readout circuit 45.

The row driver 41 and the demodulation driver 42 may activate unit pixels (PXs) of the pixel array 30 in response to a timing signal generated from the timing controller 44.

The control circuit 40 may generate a control signal to select and control at least one of a plurality of rows. The control signal may include a demodulation control signal for generating a carrier current (such as a hole current) in the substrate, a reset signal for controlling a reset transistor, a transmission (Tx) signal for controlling transmission of photocharges accumulated in a detection node, a floating diffusion (FD) signal for providing additional electrostatic capacity at a high illuminance level, a selection signal for controlling a selection transistor.

In this case, the row driver 41 may generate a reset signal, a transmission signal, a floating diffusion (FD) signal, and a selection signal, and the demodulation driver 42 may generate a demodulation control signal.

The light source driver 43 may generate a light modulation signal MLS to activate the light source 10 in response to a control signal from the timing controller 44. The light modulation signal MLS may be a signal that is modulated to have a predetermined frequency.

The timing controller 44 may generate a timing signal to control the row driver 41, the demodulation driver 42, the light source driver 43, and the readout circuit 45.

The readout circuit 45 may process pixel signals received from the pixel array 30 in response to timing signals or other control signals of the timing controller 44, and may thus generate digital pixel data. To this end, the readout circuit 45 may include a correlated double sampler (CDS) circuit for performing correlated double sampling on the pixel signals generated from the pixel array 30. In addition, the readout circuit 45 may include an analog-to-digital converter (ADC) for converting output signals of the CDS circuit into digital signals. In addition, the readout circuit 45 may include a buffer circuit that temporarily stores digital pixel data generated by the analog-to-digital converter (ADC) and outputs the pixel data under in response to timing signals or other control signals of the timing controller 44. In some implementations, the pixel array 30 includes CAPD pixels, and two column signal lines for transmitting the pixel signal may be assigned to each column of the pixel array 30. In some implementations, the pixel signal generated by each column signal line may be processed using circuitry corresponding to the respective column signal lines.

The light source 10 may emit light rays that are modulated to have a predetermined frequency toward a target object 1 captured by the image sensing device ISD. The image sensing device ISD may detect the incident light from the target object 1 to capture an image of the target object 1 and also detect the modulated light rays that are reflected from the target object 1 to generate depth information for each unit pixel (PX) based on detection of the modulated light rays. A time delay between the modulated light and the incident light is determined based on the distance between the image sensing device ISD and each target object 1. The time delay may be determined based on a phase difference between the signal generated by the image sensing device ISD and the light modulation signal MLS controlling the light source 10. An image processor (not shown) may be provided to process pixel signals from the unit pixels of the pixel array 30 to represent a captured image of the target object 1 and may further calculate a phase difference generated in the output signals of the unit pixels of the image sensing device ISD to generate a depth image including depth information for each unit pixel (PX).

Figure 2:
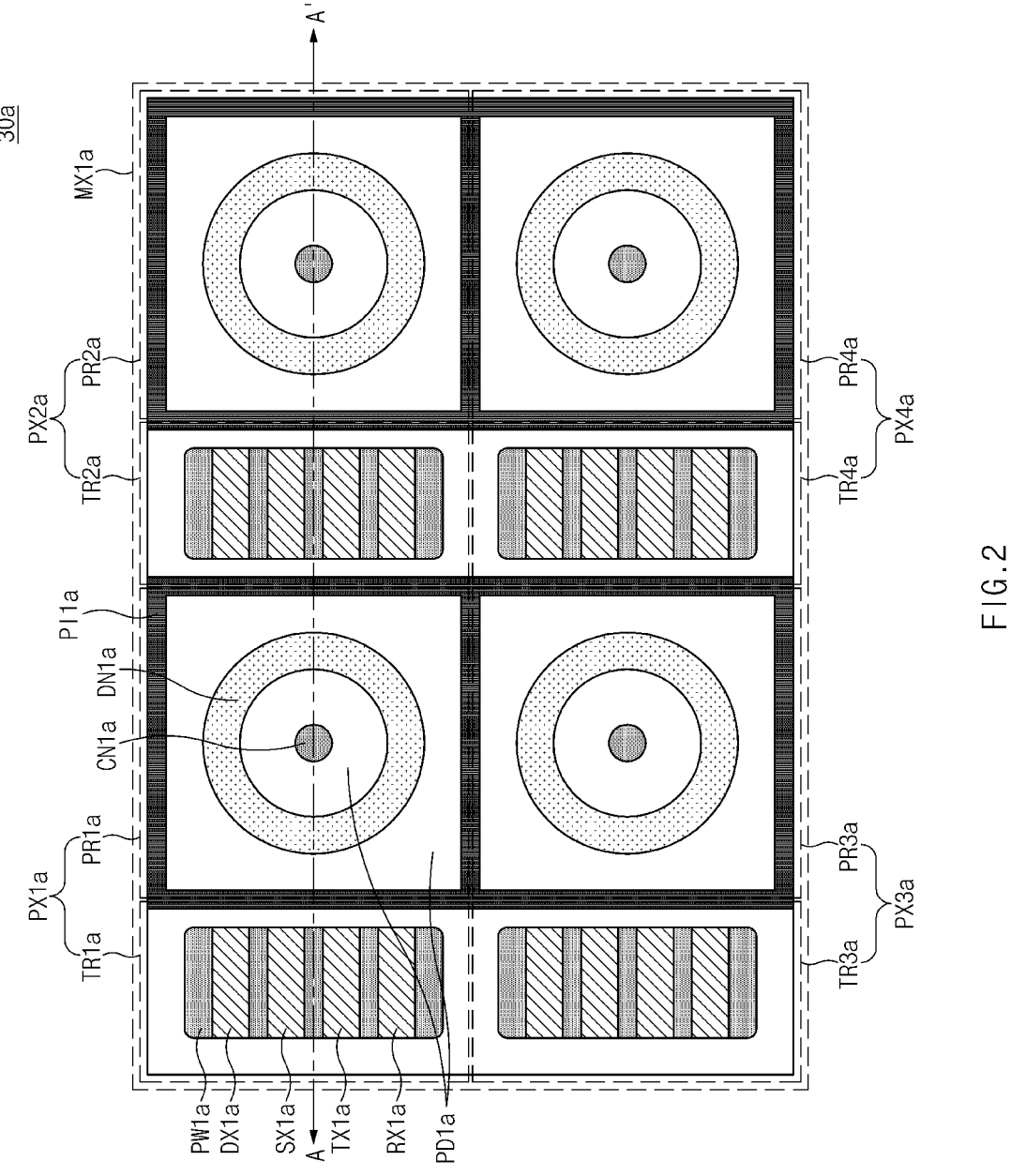
FIG. 2 is a schematic diagram illustrating an example of a pixel array shown in FIG. 1 based on some implementations of the disclosed technology.

FIG. 2 is a schematic diagram illustrating an example of four adjacent pixels of a pixel array 30*a* as an example for implementing the pixel array 30 shown in FIG. 1 based on some implementations of the disclosed technology.

Although FIG. 2 illustrates an example of a portion of the pixel array 30*a* that includes four unit pixels (PX1*a* to PX4*a*) arranged in a matrix including two rows and two columns for convenience of description, the disclosed technology is not limited thereto, and the number of rows and/or the number of columns of the pixel array 30*a* may vary.

FIG. 2 is a schematic diagram illustrating an example of configuration and structures of adjacent unit pixels (PX1*a* to PX4*a*). The spatial relationship between the constituent elements (e.g., a photoelectric conversion region, a control region, a detection region, an isolation region, a pixel transistor, etc.) included in each of the unit pixels PX1*a*-PX4*a* will be described below with reference to FIGS. 3 and 4.

The unit pixels included in the pixel array 30*a* are illustrated by example of four adjacent unit pixels referred to as first to fourth unit pixels PX1*a*, PX2*a*, PX3*a* and PX4*a*.

Four unit pixels (e.g., PX1*a* to PX4*a*) in the pixel array 30*a* may be arranged in a (2×2) matrix (e.g., MX1*a*). In some implementations, the (2×2) matrix including the first to fourth unit pixels PX1*a*-PX4*a* may be referred to as a unit matrix MX1*a*. In various implementations, the pixel array 30*a* may include an array of unit matrices with each unit matrix having four adjacent unit pixels like MX1*a*.

A demodulation control signal ($V_{cs}$) having a phase difference with respect to the modulated light may be applied to each of the unit pixels PX1*a*-PX4*a* included in the unit matrix MX1*a*. This phase modulation is used to detect the distance between a unit pixel and the target object 1 to extract the depth information for the image captured by the pixel array 30*a*.

The demodulation control signal ($V_{cs}$) may be a signal that periodically switches between an activation voltage and a deactivation voltage. The demodulation control signal ($V_{cs}$) may be applied to a control region included in each unit pixel.

For example, a demodulation control signal having no phase difference (i.e., a phase difference=0 rad) with respect to the modulated light may be applied to the first unit pixel PX1*a*. In addition, a demodulation control signal having a phase difference of π radians (rad) with respect to the modulated light may be applied to the second unit pixel PX2*a*. A demodulation control signal having a phase difference of π/2 rad with respect to the modulated light may be applied to the third unit pixel PX3*a*. In addition, a demodulation control signal having a phase difference of 3π/2 rad with respect to the modulated light may be applied to the fourth unit pixel PX4*a*.

The four adjacent unit pixels included in the pixel array 30*a* may detect incident light at a time point at which a demodulation control signal applied to each unit pixel has an activation voltage with respect to the incident light.

In addition, the unit pixels to which the demodulation control signal having the same phase are applied may be repeatedly arranged in the pixel array 30*a*.

The unit pixels PX1*a*-PX4*a* included in the pixel array 30*a* may sense or detect light incident on the image sensing device ISD during the same integration time, which indicate the same electron detection time.

In this case, the term "integration time" may refer to a specific time period during which incident light is incident upon the image sensing device ISD and a demodulation signal is applied to the unit pixels PX1*a*-PX4*a* included in the pixel array 30*a*, such that the unit pixels PX1*a*-PX4*a* can detect photocharges corresponding to the incident light that is incident upon the image sensing device ISD in response to the demodulation control signal that has an activation voltage and is applied to the image sensing device ISD.

When the activation voltage is applied to the control region, a carrier current (e.g., a hole current) may be generated, and thus a detection region adjacent to the control region can capture electric charges associated with the current. For example, the activation voltage may be set to 1.2 V in some device implementations.

When the deactivation voltage is applied to the control region, a hole current is not generated, and thus the detection region adjacent to the control region does not capture electric charges. For example, the deactivation voltage may be set to zero volts (0V) in some device implementations. The demodulation control signal, which has the activation voltage or the deactivation voltage, may be applied to the control region during a predetermined time period. The generated carrier current can be a hole current formed by holes in the doped substrate or an electron current formed by electrons depending on the doping type in the substrate.

The control circuit 40 based on some implementations of the disclosed technology may simultaneously transmit a demodulation control signal having an activation voltage to the adjacent unit pixels (e.g., PX1a and PX3a), such that the unit pixels (e.g., PX1a and PX3a) can reduce a photocharge detection time corresponding to incident light.

The photoelectric conversion regions respectively included in the unit pixels PX1a-PX4a may generate photocharges corresponding to incident light. The image processor (not shown) may acquire image information by detecting the incident light from the target object 1 and may acquire information about the distance to the target object 1 using a pixel signal corresponding to the generated photocharges based on the signal modulation containing phase differences.

Each of the unit pixels PX1a-PX4a may receive a demodulation control signal that has a predetermined phase difference (which may be represented by a phase angle) with respect to the modulated light during the integration time. The image sensing device ISD may detect a pixel signal for each of the unit pixels PX1a-PX4a according to a demodulation signal applied thereto.

The demodulation signal applied to each of the unit pixels PX1a-PX4a included in the unit matrix MX1a will be described later with reference to FIG. 5.

The unit pixels to which the demodulation control signal having the same phase as the modulated light is applied may be repeatedly arranged at predetermined positions in the pixel array 30a.

Therefore, the operation for detecting light incident upon the respective unit pixels PX1a-PX4a included in the unit matrix MX1a can also be substantially and equally applied to another (2×2) matrix included in the pixel array 30a.

The unit pixels PX1a-PX4a arranged in the pixel array 30a may be identical in structure to each other. Therefore, for convenience of description, the structure of the first unit pixel PX1a will be discussed below as an example.

Each unit pixel (e.g., PX1a) included in the pixel array 30a may include a light reception region (e.g., PR1a) and a transistor region (e.g., TR1a).

The light reception region PR1a may include a photoelectric conversion area PD1a for converting incident light into photocharges, a control region CN1a for receiving a demodulation control signal as an input, a detection region DN1a for detecting or capturing photocharges according to a demodulation control signal, and a light reception isolation region PI1a formed to surround the control region DN1a.

The transistor region TR1a may include a transfer transistor TX1a for controlling transmission of photocharges accumulated in the detection region DN1a, a drive transistor DX1a for amplifying a signal corresponding to the received photocharges, a selection transistor SX1a for transmitting an output signal of the drive transistor DX1a to a signal line, a reset transistor RX1a for resetting the unit pixel PX1a to a pixel voltage ($V_{px}$), and a floating diffusion (FD) region (not shown) for receiving photocharges through the transfer transistor TX1a.

The photoelectric conversion region PD1a may be formed in a semiconductor substrate. For example, the semiconductor substrate may be a monocrystalline silicon substrate. In an implementation, the substrate may be a P-type or N-type bulk substrate. In another implementation, the substrate may be formed by growing a P-type or N-type epitaxial layer on the P-type bulk substrate. In another implementation, the substrate may be formed by growing a P-type or N-type epitaxial layer on the N-type bulk substrate. Hereinafter, it is assumed that the substrate is a silicon substrate doped with P-type impurities.

Each unit pixel PX1a may include a photoelectric conversion region PD1a isolated from other adjacent unit pixels (e.g., PX2a and PX3a) by a light reception isolation region PI1a. Each unit pixel PX1a may include one photoelectric conversion region PD1a electrically isolated from adjacent unit pixels (e.g., PX2a, PX3a).

The photoelectric conversion region PX1a may have as large a light receiving region as possible to increase light reception (Rx) efficiency of the unit pixel PX1a. The photoelectric conversion region PX1a may receive incident light, and may generate photocharges corresponding to the received incident light.

In some implementations, the control region CN1a may be disposed at a center portion of the photoelectric conversion region PD1a. The control region CN1a may be doped with P-type impurities. In this case, the control region CN1a may have a higher doping concentration than the substrate. The control region CN1a may correspond to each unit pixel PX1a. In other words, one unit pixel PX1a may include one control region CN1a.

In an implementation, the control region CN1a doped with such impurities is formed in a circular shape when viewed from a direction perpendicular to one surface of the substrate. In another implementation, the control region CN1a doped with impurities is formed in a shape that is different from the circular shape as long as a carrier current (such as a hole current) can be easily and uniformly generated in the unit pixel PX1a. For example, the control region CN1a may be formed in a polygonal shape such as a square shape or an octagonal shape.

A demodulation control signal having an activation voltage may be applied to the control region 120, such that a hole current may be generated in the photoelectric conversion region PD1a of the substrate. The hole current may be generated by movement of an electron hole in a semiconductor substrate. Specifically, the hole current may be generated by applying a voltage to a P-type doped semiconductor substrate.

In some implementations, a hole current may be generated between the control region CN1a, to which the demodulation control signal corresponding to the activation voltage is applied, and a passivation region (not shown) formed in the substrate.

A ground voltage ($V_{gnd}$) may be applied to the passivation region (not shown). For example, the ground voltage ($V_{gnd}$) may be set to zero volts (0V). The ground voltage ($V_{gnd}$) may be the same voltage as the deactivation voltage of the demodulation control signal.

Accordingly, when a demodulation control signal having a deactivation voltage is applied to the control region CN1a, a hole current may not be generated between the control region CN1a and the passivation region. On the other hand, a hole current may flow between the passivation region and the control region CN1a, to which the demodulation control signal having the activation voltage is applied. The features of the passivation region will be described with reference to FIG. 3.

The hole current may move photocharges generated in the photoelectric conversion region PD1a. Since the photocharges move along the hole current, the unit pixel PX1a can easily detect the generated photocharges.

The detection region DN1a can detect photocharges that moves along the hole current. The detection region DN1a may be doped with N-type impurities. In some implementations, the detection region DN1a may be formed to surround the control region CN1a. The detection region DN1a may be formed adjacent to the control region CN1a, such that the detection region DN1a can easily capture photocharges that move due to a hole current generated between the control region CN1a and the passivation region (not shown).

As discussed above, the detection region DN1a has the circular shape. In some implementations, the detection region DN1a may have any shape that can capture photocharges moving along the hole current. For example, the detection region DN1a may be formed in a polygonal shape such as a square shape or an octagonal shape.

In some implementations, each unit pixel PX1a may include a single control region CN1a and a single detection region DN1a.

The light reception isolation region PI1a may be formed in a structure that surrounds the photoelectric conversion region PD1a. The light reception isolation region PI1a may isolate the photoelectric conversion region PD1a from other adjacent unit pixels. Also, the light reception isolation region PI1a may have a shape that surrounds the detection region DN1a.

In some implementations, the light reception isolation region PI1a may have a trench structure extending from one surface of the substrate toward another surface opposite to the one surface of the substrate. Also, the trench structure may have a structure including a plurality of layers.

In some embodiments of the disclosed technology, the light reception isolation region PI1a can prevent photocharges from moving between adjacent unit pixels arranged in rows and columns of the pixel array 30a, thereby reducing or minimizing noises may occur in a pixel signal corresponding to the photocharges.

The light reception isolation region PI1a may be formed in a square (or rectangular) shape. In some implementations, the light reception isolation region PI1a may have any shape that can distinguish the photoelectric conversion region PD1a from other adjacent unit pixels while maximizing the area of the photoelectric conversion region PD1a. For example, the light reception isolation region PI1a may be formed in a circular shape, or may also be formed in a polygonal shape such as an octagonal shape as needed.

The unit pixel PX1a may include the light reception isolation region PI1a to prevent photocharges from moving between adjacent unit pixels (e.g., PX1a and PX2a), thereby reducing or minimizing crosstalk of incident light.

For example, during operation of the adjacent unit pixels PX1a and PX2a, an activation voltage and a deactivation voltage may be applied to each of control regions included in the unit pixels PX1a and PX2a.

In a situation where the unit pixel PX1a does not include the light reception isolation region PI1a, when an activation voltage is applied to the control region CN1a of the first unit pixel PX1a and a deactivation voltage is applied to the control region of the second unit pixel PX2a, a hole current is generated and flows between the adjacent unit pixels PX1a and PX2a.

In other words, when the light reception isolation region PI1a does not exist, photocharges generated by the unit pixel including the control region to which the deactivation voltage is applied may be detected in the detection region of the unit pixel including the control region to which the activation voltage is applied.

When photocharges generated in the unit pixel to which the deactivation voltage is applied is detected at the unit pixel to which the activation voltage is applied, noise may occur in a pixel signal output from the unit pixel to which the activation voltage is applied.

Noise in a pixel signal can negatively affect the accuracy of the phase difference detection and distance calculation. The disclosed technology can be implemented in some embodiments to prevent noise in the pixel signal by adding the light reception isolation region PI1a to the unit pixel PX1a to block the flow of hole current between adjacent unit pixels (e.g., PX1a and PX2a).

In some implementations, the light reception isolation region PI1a may include an insulation layer formed of an insulating material such as silicon oxide, and photoelectric conversion regions respectively included in the unit pixels can be physically and electrically isolated from each other by the insulation layer.

As the light reception isolation region PI1a is formed, demodulation control signals having activation voltages can be simultaneously applied to different adjacent unit pixels (e.g., PX1a and PX2a). In other words, photocharges can be simultaneously detected in detection regions of different unit pixels PX1a and PX2a.

As the light reception isolation region PI1a is formed, light incident upon the light reception regions (e.g., PR1a and PR2a) of unit pixels (e.g., PX1a and PX2a) does not affect adjacent unit pixels.

As the light reception isolation region PI1a is formed, the photoelectric conversion region PD1a and the transistor region TR1a that are included in each unit pixel (e.g., PX1a) can be isolated from each other.

In some implementations, the light reception isolation region PI1a may include a reflection layer including a reflective material such as metal, and incident light incident upon each unit pixel by the reflection layer may be guided to the photoelectric conversion region (e.g., PD1a) included in each unit pixel (e.g., PX1a).

The transistor region TR1a may include not only a drive transistor DX1a, a selection transistor SX1a, a transfer transistor TX1a, a reset transistor RX1a, and a floating diffusion (FD) region (not shown), but also a signal line (not shown) and a capacitor (not shown) connected to these transistors. The features of constituent elements of the transistor region TR1a and the relationship between the constituent elements of the transistor region TR1a and a method for operating the constituent elements included in the transistor region TR1a will be described below with reference to FIG. 4.

The transistors (e.g., DX1a, SX1a, TX1a, and RX1a) may process and output a pixel signal output from the detection region DN1a.

The transistor region TR1a may include a well region PW1a in which a plurality of transistors (e.g., DX1a, SX1a, TX1a, and RX1a) is disposed. The well region PW1a may be a layer in the semiconductor substrate that is doped with P-type impurities, and may have a higher doping concentration than the semiconductor substrate. In some implementations, source or drain regions of a plurality of transistors (e.g., DX1a, SX1a, TX1a, and RX1a) may be formed in the well region PW1a.

A ground voltage ($V_{gnd}$) may be applied to the well region PW1a. For example, the ground voltage may be set to zero volts (0V). As the ground voltage is applied to the well region PW1a, leakage current generated in the transistor region TR1a may be reduced. The well region PW1a may be formed to extend from one surface of the semiconductor substrate to another surface opposite to the one surface.

Figure 3:
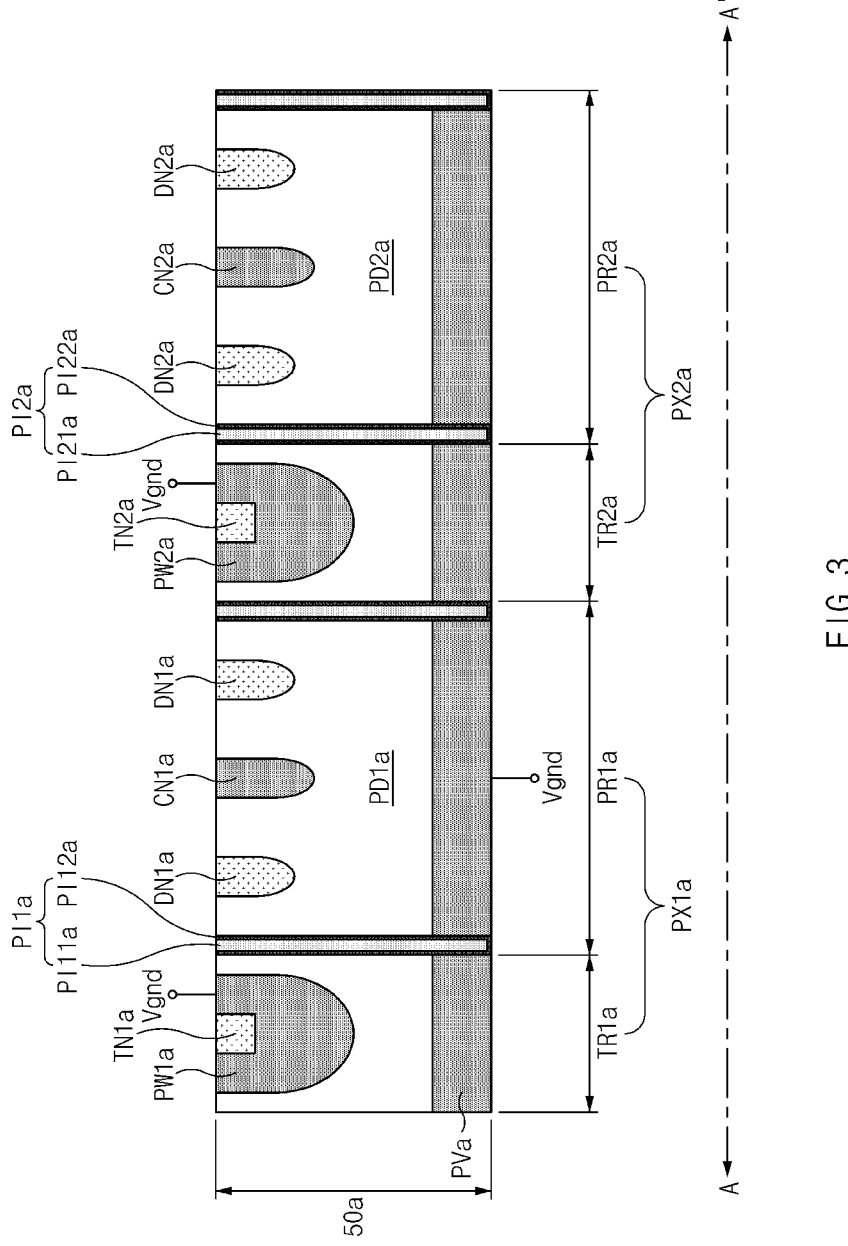
FIG. 3 is a cross-sectional view illustrating an example of the pixel array taken along a first cutting line shown in FIG. 2 based on some implementations of the disclosed technology.

FIG. 3 is a cross-sectional view illustrating an example of the pixel array taken along a first cutting line A-A' shown in FIG. 2 based on some implementations of the disclosed technology.

FIG. 3 illustrates shapes and arrangements of constituent elements formed in the semiconductor substrate 50a.

Referring to FIG. 3, the semiconductor substrate 50a may include one surface at which the well regions (PW1a, PW2a), the detection regions (DN1a, DN2a), and the control regions (CN1a, CN2a) are located, and the other surface opposite to the one surface and formed to have a passivation region (PVa) thereon.

In addition, the semiconductor substrate 50a may include a plurality of different unit pixels (PX1a, PX2a), and the unit pixel (PX1a, PX2a) may include transistor regions (TR1a, TR2a) and light reception regions (PR1a, PR2a). In some implementations, the unit pixel PX1a may include a transistor region TR1a and a light reception region PR1a, and the unit pixel PX2a may include a transistor region TR2a and a light reception region PR2a.

The first unit pixel PX1a and the second unit pixel PX2a are substantially identical in structure to each other. For convenience of description, the first unit pixel PX1a will be discussed below as an example.

The first transistor region TR1a included in the first unit pixel PX1a may include a first well region PW1a to which the ground voltage ($V_{gnd}$) is applied, and the first well region PW1a may include a first doped region TN1a.

The first doped region TN1a may be a source region or a drain region of at least one transistor from among a plurality of transistors (DX1a, SX1a, TX1a, or RX1a of FIG. 2) included in the first transistor region TR1a. Gates (not shown) of the plurality of transistors (DX1a, SX1a, TX1a, or RX1a of FIG. 2) may be formed at one surface of the semiconductor substrate 50a.

In some implementations, the first well region PW1a may be a region doped with P-type impurities, and the first doped region TN1a may be a region doped with N-type impurities. The first well region PW1a may be formed through an implantation process to have a shape extending from one surface to the other surface of the semiconductor substrate 50a.

The first well region PW1a may include a plurality of P-type impurity regions having different concentrations. In some implementations, the first well region PW1a may extend from one surface of the semiconductor substrate 50a to a first depth in the semiconductor substrate 50a.

In some implementations, the ground voltage ($V_{gnd}$) applied to the first well region PW1a may prevent leakage current at the plurality of transistors (DX1a, SX1a, TX1a or RX1a of FIG. 2) formed on the first well region PW1a.

The first light reception region PR1a included in the first unit pixel PX1a may include a first photoelectric conversion region PD1a, a first detection region DN1a, a first control region CN1a, and a first light reception isolation region PI1a.

The first photoelectric conversion region PD1a may be disposed in the semiconductor substrate 50a. In some implementations, the first photoelectric conversion region PD1a may include part of the semiconductor substrate 50a corresponding to the first light reception region PR1a other than the first detection region DN1a, the first control region CN1a, and the first light reception isolation region PI1a.

In some implementations, the first photoelectric conversion region PD1a include P-type or N-type impurity regions that are stacked in a silicon substrate doped with P-type impurities.

The first detection region DN1a may include an N-type impurity region. In some implementations, the N-type impurity region may include a plurality of regions having different concentrations.

A first N-type impurity region (e.g., N-region) having a relatively low doping concentration may be implanted into the semiconductor substrate 50a, and a second N-type impurity region (e.g., $N^+$ region) having a relatively high doping concentration may be implanted at the same position as the first N-type impurity region, resulting in formation of the first detection region DN1a.

In some implementations, the first detection region DN1a may extend from one surface of the semiconductor substrate 50a to a second depth in the semiconductor substrate 50a. As the second depth is adjusted, a depth at which the first detection region DN1a captures photocharges in the semiconductor substrate 50a may be adjusted.

In some implementations, the first depth of the first well region PW1a may be greater than the second depth of the first detection region DN1a. The first well region PW1a having the first depth greater than the second depth of the first detection region DN1a can block more leakage current.

The first detection region DN1a may capture and accumulate photocharges generated in the first photoelectric conversion region PD1a.

The first control region CN1a may include a P-type impurity region. In some implementations, the P-type impurity region may include a plurality of regions having different concentrations. The first control region CN1a may correspond to the first unit pixel PX1a. The first unit pixel PX1a may include only one first control region CN1a.

A first P-type impurity region (i.e., $P^-$ region) having a relatively low doping concentration may be implanted into the semiconductor substrate 50a, and a second P-type impurity region (i.e., $P^+$ region) having a relatively high doping concentration may be implanted at the same position as the first P-type impurity region, resulting in formation of the first control region CN1a.

In some implementations, the first control region CN1a may extend from one surface of the semiconductor substrate 50a to a third depth in the semiconductor substrate 50a. As the third depth is adjusted, an electric field to be formed in the semiconductor substrate 50a may be adjusted by a voltage applied to the first control region CN1a and the passivation region PVa.

In some implementations, the first depth of the first well region PW1a may be greater than the third depth of the first control region CN1a. In addition, the third depth of the first control region CN1a may be greater than the second depth of the first detection region DN1a.

Since the first control region CN1a is formed to have a greater depth than the first detection region DN1a, the electric field in the semiconductor substrate 50a allows the first detection region DN1a to easily detect photocharges generated in the semiconductor substrate 50a.

The first light reception isolation region PI1a may have a trench structure that surrounds the first photoelectric conversion region PD1a and extends from one surface of the semiconductor substrate 50a to the other surface opposite to the one surface.

The first light reception isolation region PI1a may be formed in a trench etched from one surface of the semiconductor substrate 50a to the other surface thereof.

The first light reception isolation region PI1a may include a plurality of layers (PI11a, PI12a). For example, the first light reception isolation region PI1a may include a first insulation layer PI12a disposed to contact a sidewall and bottom surface of the trench, and a first reflection layer PI11a surrounded by the first insulation layer PI12a.

In some implementations, the first reflection layer PI11a may include a metal material such as tungsten (W), and the first insulation layer PI12a may include an insulating material such as silicon oxide.

The first light reception isolation region PI1a may physically and electrically isolate the first photoelectric conversion region PD1a from other adjacent unit pixels (e.g., PX2a) to prevent leakage of photocharges. In addition, the first light reception isolation region PI1a may reflect light incident upon the first photoelectric conversion region PD1a toward the first photoelectric conversion region PD1a to improve light reception efficiency of the first photoelectric conversion region PD1a.

The passivation region PVa may be doped with P-type impurities in the semiconductor substrate 50a. The passivation region PVa may be located at another surface facing away from one surface of the semiconductor substrate 50a, and may be doped with P-type impurities having a higher concentration than the semiconductor substrate 50a.

The passivation region PVa may be formed over the entire pixel array (e.g., 30a of FIG. 2) included in the semiconductor substrate 50a. In other words, each of the unit pixels (e.g., PX1a and PX2a) included in the pixel array 30a may include the passivation region PVa.

The ground voltage ($V_{gnd}$) may be applied to the passivation region PVa. The ground voltage ($V_{gnd}$) may be, for example, zero volts (0V).

As the ground voltage ($V_{gnd}$) is applied to the passivation region PVa, a hole current may flow between the first control region CN1a, to which the activation voltage is applied, and the passivation region PVa. Accordingly, photocharges generated in the first photoelectric conversion region PD1a may move along the flow of the hole current.

Figure 4:
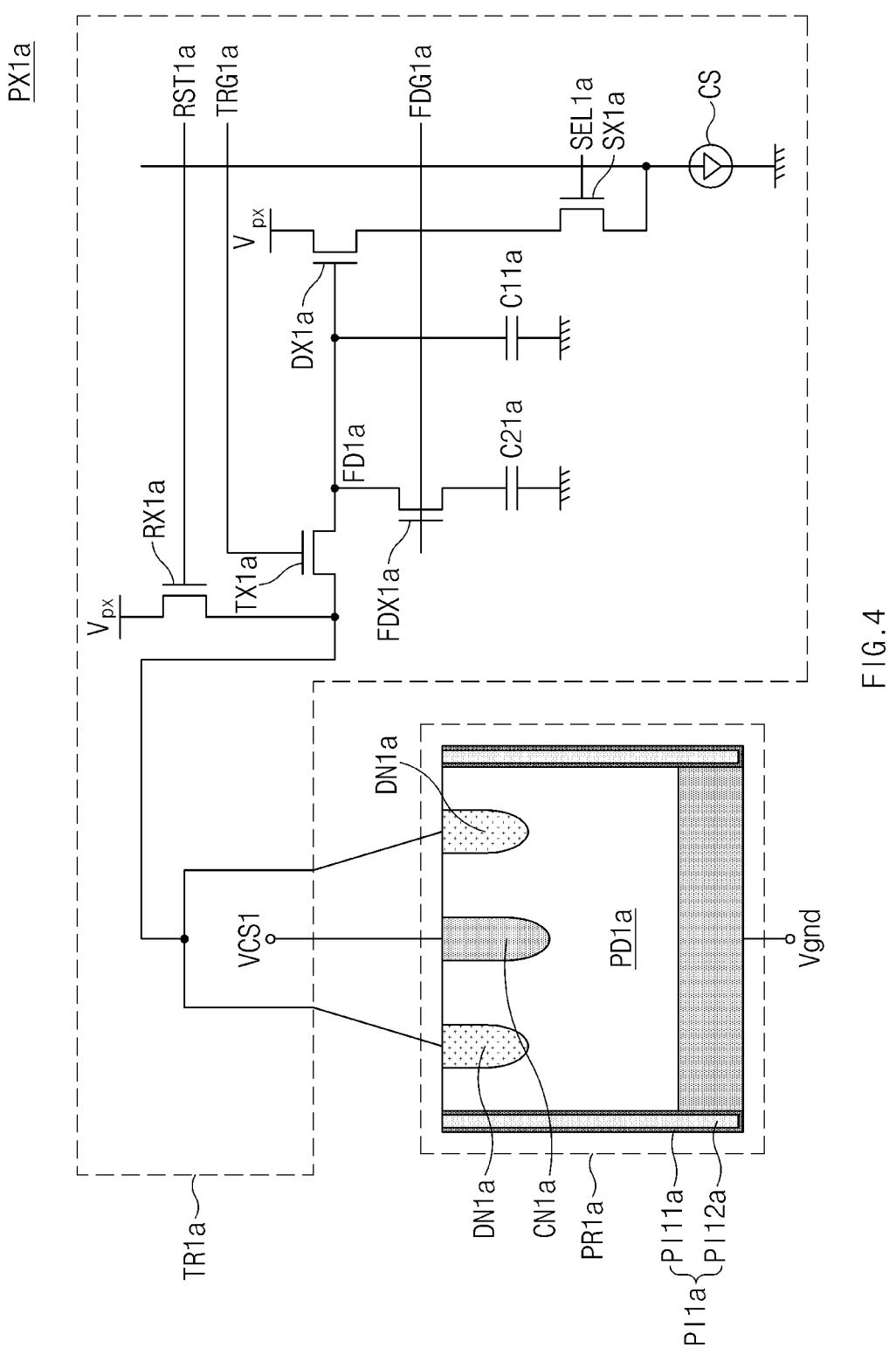
FIG. 4 is a schematic diagram illustrating a cross-section of an example of a unit pixel taken along a first cutting line shown in FIG. 2 and circuitry included in the unit pixel based on some implementations of the disclosed technology.

FIG. 4 is a schematic diagram illustrating a cross-section of the unit pixel taken along the first cutting line A-A' shown in FIG. 2 and circuitry included in the unit pixel based on some implementations of the disclosed technology.

In FIG. 4, the structure and operations of the first unit pixel PX1a will hereinafter be described with reference to the cross-sectional view of the first unit pixel PX1a taken along the first cutting line A-A' shown in FIG. 3 and a plurality of elements connected to the first light reception region PR1a.

The unit pixels included in the pixel array 30a are substantially identical in structure to each other, and as such redundant description thereof will herein be omitted for brevity.

A region in which elements connected to the first light reception region PX1a are disposed may be referred to as a first transistor region TR1a. The first transistor region TR1a may include a first well region PW1a that is doped with P-type impurities upon receiving the ground voltage ($V_{gnd}$).

As the demodulation control signal ($V_{cs}$) is applied to the first control region CN1a, a hole current may flow between the passivation area PVa and the first control region CN1a. Whether the hole current flows may be determined according to an electric potential difference between the voltage of the demodulation control signal ($V_{cs}$) applied to the first control region CN1a and the ground voltage ($V_{gnd}$) applied to the passivation region PVa.

For example, the activation voltage of the demodulation control signal ($V_{cs}$) may be 1.2 volts (1.2 V) and the deactivation voltage may be zero volts (0V). When the ground voltage ($V_{gnd}$) is set to zero volts (0V) and an activation voltage is applied to the first control region CN1a, a hole current may flow between the first control region CN1a and the passivation region PVa.

The first detection region DN1a may capture photocharges that are generated at the first photoelectric conversion region PD1a and move along the flow of the hole current. The captured photocharges may be processed by constituent elements of the first transistor region TR1a.

The elements for processing the photocharges captured by the first detection region CN1a will hereinafter be described in detail with reference to the attached drawings. The first transistor region TR1a may include a reset transistor RX1a, a transfer transistor TX1a, a first capacitor C11a, a second capacitor C21a, a floating diffusion (FD) transistor FDX1a, a drive transistor DX1a, and a selection transistor SX1a.

The control signals (e.g., RST1a, TRG1a, FDG1a, SEL1a) applied by the control circuit 40 to the plurality of elements included in the first transistor region TR1a. In addition, the pixel voltage ($V_{px}$) may be a power-supply voltage VDD or a source voltage VSS.

The reset transistor RX1a may be activated in response to a logic high level of the reset signal RST1a applied to a gate electrode thereof, such that the electric potential of the floating diffusion region FD1a and the electric potential of the first detection region DN1a may be reset to a predetermined level (e.g., the pixel voltage $V_{px}$). In addition, when the reset transistor RX1a is activated (e.g., active state), the transfer transistor TX1a can also be activated (e.g., active state) to reset the floating diffusion region FD1a.

The transfer transistor TX1a may be activated (e.g., active state) in response to a logic high level of the transfer signal TRG1a applied to a gate electrode thereof, such that photocharges accumulated in the first detection region DN1a can be transmitted to the floating diffusion region FD1a.

The first capacitor C11a may be coupled to the floating diffusion region FD1a, such that the first capacitor C11a can provide predefined electrostatic capacity.

The second capacitor C21a may be selectively coupled to the floating diffusion region FD1a according to operations of the floating diffusion transistor FDX1a, such that the second capacitor C21a can provide additional predefined electrostatic capacity.

Each of the first capacitor C11a and the second capacitor C21a may include, for example, at least one of a Metal-Insulator-Metal (MIM) capacitor, a Metal-Insulator-Polysilicon (MIP) capacitor, a Metal-Oxide-Semiconductor (MOS) capacitor, and a junction capacitor.

The floating diffusion transistor FDX1a may be activated (e.g., active state) in response to a logic high level of the floating diffusion signal FDG1a applied to a gate electrode thereof, such that the floating diffusion transistor FDX1a may electrically connect the second capacitor C21a to the floating diffusion region FD1a.

For example, when the amount of incident light corresponds to a relatively high illuminance condition, the control circuit 40 may activate the floating diffusion transistor FDX1a, such that the floating diffusion transistor FDX1a enters the active state and the floating diffusion region FD1a can be coupled to the second capacitor C21a. As a result, when the amount of incident light corresponds to a high illuminance level, the floating diffusion region FD1a can accumulate much more photocharges therein, which makes it possible to guarantee a high dynamic range (HDR).

On the other hand, when the amount of incident light is not sufficient and thus corresponds to a relatively low illuminance level, the control circuit 40 may control the floating diffusion transistor FDX1a to be deactivated (e.g., inactive state), such that the floating diffusion region FD1a can be isolated from the second capacitor C21a.

In some other implementations, the floating diffusion transistor FDX1a and the second capacitor C21a may be omitted.

A drain electrode of the drive transistor DX1a is coupled to the pixel voltage ($V_{px}$) and a source electrode of the drive transistor DX1a is coupled to a vertical signal line through the selection transistor SX1a, such that a load (MOS) and a source follower circuit of a constant current source circuit CS coupled to one end of the vertical signal line can be constructed. Thus, the drive transistor DX1a may output a current corresponding to the electric potential of the floating diffusion node FD1a coupled to a gate electrode to the vertical signal line through the selection transistor SX1a.

The selection transistor SX1a may be activated (e.g., active state) in response to a logic high level of the selection signal SEL1a applied to a gate electrode thereof, such that the pixel signal generated from the drive transistor DX1a can be output to the vertical signal line.

Each pixel signal applied to the vertical signal line through the first transistor region TR1a may be performed by noise cancellation and analog-to-digital (ADC) conversion processing, such that the pixel signal can be converted into image data.

The pixel signals from the unit pixels are processed to obtain both the image information of an image of the target object captured by the pixel array and the depth information of the captured image. For the imaging capture operation, the image processor (not shown) may calculate image data acquired from photocharges captured by the detection region (e.g., DN1a) included in each of four adjacent unit pixels (e.g., PX1a, PX2a, PX3a, and PX4a of FIG. 2). This captured image is represented by a 2-D array of pixel generated photocharges amounts from unit pixels in the pixel array For the depth information of the captured image, and the image processor may calculate a phase difference using the calculated image data. The image processor (not shown) may calculate depth information indicating the distance to the target object 1 based on a phase difference corresponding to each pixel signal detected by each unit pixel (PXa) to generate a depth image including the depth information corresponding to each pixel.

Figure 5:
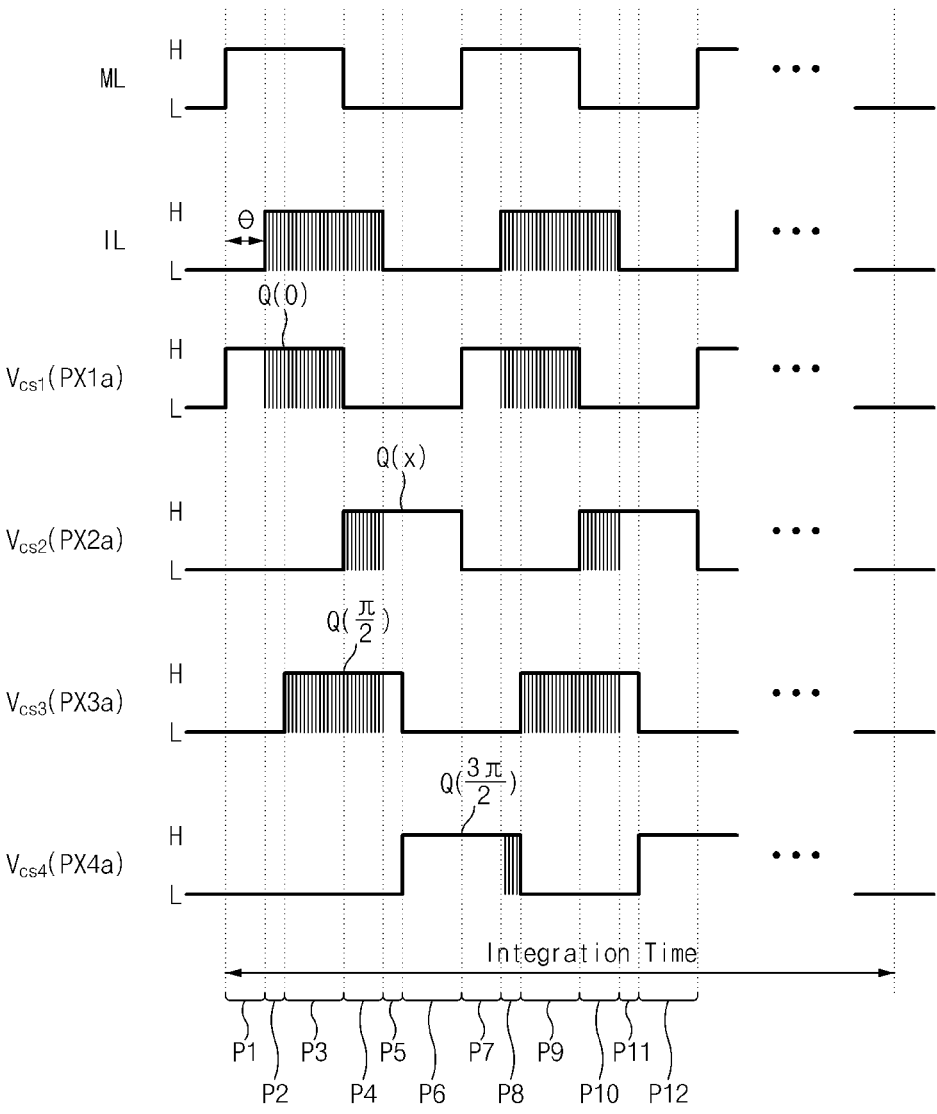
FIG. 5 is a timing diagram illustrating operations of an image sensing device based on some implementations of the disclosed technology.

FIG. 5 is a timing diagram illustrating operations of the image sensing device ISD based on some implementations of the disclosed technology.

The modulated light (ML), the incident light (IL), and the first to fourth demodulation control signals $V_{cs1}$-$V_{cs4}$ are illustrated in FIG. 5.

The unit pixels to which the demodulation control signal having the same phase is applied are repeatedly arranged in the pixel array 30a. The operation for detecting light incident upon the respective unit pixels PX1a-PX4a included in the unit matrix MX1a can be applied to another (2×2) matrix included in the pixel array 30a.

For convenience of description, as shown in FIG. 5, control signals applied to the unit pixels PX1a-PX4a will be described below using the unit pixels PX1a-PX4a included in the unit matrix MX1a shown in FIG. 2 as an example.

A demodulation control signal having different phase differences with respect to the modulated light (ML) may be applied to the first to fourth unit pixels PX1a-PX4a. For example, a demodulation control signal ($V_{cs1}$) having no phase difference (e.g., 0 rad) with respect to the modulated light (ML) may be applied to the first unit pixel PX1a. In addition, a demodulation control signal ($V_{cs2}$) having a phase difference (e.g., π rad) with respect to the modulated light (ML) may be applied to the second unit pixel PX2a. A demodulation control signal ($V_{cs3}$) having a phase difference (e.g., π/2 rad) with respect to the modulated light (ML) may be applied to the third unit pixel PX3a. In addition, a demodulation control signal ($V_{cs4}$) having a phase difference (e.g., 3π/2 rad) with respect to the modulated light (ML) may be applied to the fourth unit pixel PX4a.

The first demodulation control signal ($V_{cs1}$) may be applied to the first control region CN1a of the first unit pixel PX1a shown in FIG. 2. Similarly, the second demodulation control signal ($V_{cs2}$) may be applied to the second control region CN2a of the second unit pixel PX2a shown in FIG. 2. In addition, the third demodulation control signal ($V_{cs3}$) may be applied to the third control region CN3a of the third unit pixel PX3a shown in FIG. 2. The fourth demodulation control signal ($V_{cs4}$) may be applied to the fourth control region CN4a of the fourth unit pixel PX4a shown in FIG. 2.

The first unit pixel PX1a may detect photocharges corresponding to incident light received at a time point at which the demodulation control signal ($V_{cs1}$) has an activation voltage. The second unit pixel PX2a may detect photocharges corresponding to incident light received at a time point at which the demodulation control signal ($V_{cs2}$) has an activation voltage. The third unit pixel PX3a may detect photocharges corresponding to incident light received at a time point at which the demodulation control signal ($V_{cs3}$) has an activation voltage. The fourth unit pixel PX4a may detect photocharges corresponding to incident light received at a time point at which the demodulation control signal ($V_{cs4}$) has an activation voltage.

As described above, each of the unit pixels PX1a to PX4a may be reset to a predetermined voltage (e.g., a pixel voltage $V_{px}$) by a reset transistor (e.g., RX1a) such that each unit pixel can detect photocharges corresponding to incident light received at a time point at which each of the demodulation control signals ($V_{cs1}$, $V_{cs2}$, $V_{cs3}$, $V_{cs4}$) has an activation voltage.

Since the unit pixels PX1a-PX4a are reset to a predetermined voltage before reaching a time point at which each of the demodulation control signals ($V_{cs1}$, $V_{cs2}$, $V_{cs3}$, $V_{cs4}$) has an activation voltage, the unit pixels PX1a-PX4a can detect only photocharges corresponding to incident light during an integration time.

The transfer transistor (e.g., TX1a) may have a logic high value when photocharges move from the detection region (e.g., DN1a) to the floating diffusion region (e.g., FD1a) during the integration time. After photocharges have moved through the transfer transistor TX1a, the photocharges accumulated in the floating diffusion region FD1a can be output as a pixel signal after passing through the drive transistor (e.g., DX1a) and the selection transistor (e.g., SX1a).

After the photocharges accumulated in the floating diffusion region FD1a is output as a pixel signal, the control circuit 40 may activate the reset transistor RX1a to reset each of the unit pixels PX1a to PX4a.

The modulated light (ML) may refer to light that is emitted to the target object 1 by the light source 10 controlled by the control circuit 40. The modulated light (ML) may have a high-level section (i.e., a period in which light is emitted) and a low-level section (i.e., a period in which light is not emitted) that are alternately arranged on a time axis.

The incident light (IL) may refer to light that is incident upon the substrate to generate electron-hole pairs through photoelectric conversion. The incident light (IL) may have a phase difference (θ) that is changed with the distance between the image sensing device ISD and the target object 1.

The level of each of the modulated light (ML) and the incident light (IL) shown in FIG. 5 may refer to the intensity of light. For example, "H" may refer to high-intensity light, and "L" may refer to low-intensity light.

While electrons generated by the incident light (IL) are captured in the detection region (e.g., DN1a) included in each of the unit pixels PX1a-PX4a, each of the first demodulation control signal ($V_{cs1}$), the second demodulation control signal ($V_{cs2}$), the third demodulation control signal ($V_{cs3}$), and the fourth demodulation control signal ($V_{cs4}$) may alternate or toggle between a deactivation voltage (L) indicating a low level and an activation voltage (H) indicating a high level. For example, the activation voltage of each of the demodulation control signals $V_{cs1}$-$V_{cs4}$ may be set to 1.2 V, and the deactivation voltage of each of the demodulation control signals $V_{cs1}$-$V_{cs4}$ may be set to zero volts (0V).

In addition, the first demodulation control signal ($V_{cs1}$) may have the same phase as the modulated light (ML), the second demodulation control signal ($V_{cs2}$) may have a phase difference of 180° (or It radians) with respect to the modulated light (ML), the third demodulation control signal ($V_{cs3}$) may have a phase difference of 90° (or π/2 radians) with respect to the modulated light (ML), and the fourth demodulation control signal ($V_{cs4}$) may have a phase difference of 270° (or 3 π/2 radians) with respect to the modulated light (ML).

In some implementations, it is assumed that no phase difference occurs between the light modulation signal MLS generating the modulated light (ML) and the modulated light (ML) for convenience of description, such that the light modulation signal MLS and the modulated light (ML) may have the same phase.

Each of the demodulation control signals $V_{cs1}$-$V_{cs4}$ may be configured in a manner that a deactivation voltage L indicating a low level and an activation voltage H indicating a high level are repeated at intervals of a predetermined time during the integration time, and the detection operation of the unit pixels PX1a-PX4a will hereinafter be described using the first to twelfth periods P1-P12 as example periods.

The first demodulation control signal ($V_{cs1}$) may have the activation voltage (H) in the first period P1, the second period P2, the third period P3, the seventh period P7, the eighth period P8, and the ninth period P9, and may have the deactivation voltage (L) in the remaining periods other than the above periods P1-P3 and P7-P9.

The second demodulation control signal ($V_{cs2}$) may have the activation voltage (H) in the fourth period P4, the fifth period P5, the sixth period P6, the ninth period P9, the eleventh period P11, and the twelfth period P12, and may have the deactivation voltage (L) in the remaining periods other than the above periods P4-P6, P9, P11, and P12.

The third demodulation control signal ($V_{cs3}$) may have the activation voltage (H) in the third period P3, the fourth period P4, the fifth period P5, the ninth period P9, the tenth period P10, and the eleventh period P11, and may have the deactivation voltage (L) in the remaining periods other than the above periods P3-P5 and P9-P11.

The fourth demodulation control signal ($V_{cs4}$) may have the activation voltage (H) in the sixth period P6, the seventh period P7, the eighth period P8, and the twelfth period P12, and may have the deactivation voltage (L) in the remaining periods other than the above periods P6-P8 and P12.

The first to fourth demodulation control signals $V_{cs1}$-$V_{cs4}$ respectively applied to the four adjacent unit pixels PX1a-PX4a may simultaneously have the activation voltage (H) in a specific period. For example, the first demodulation control signal ($V_{cs1}$) and the third demodulation control signal ($V_{cs3}$) may simultaneously have the activation voltage (H) in the third period P3 and the ninth period P9.

The light reception isolation structure (e.g., PI1a) included in each of the unit pixels PX1a-PX4a may control movement of photocharges between the adjacent unit pixels PX1a-PX4a, and the control circuit 40 may detect the photocharges by simultaneously applying the activation voltage (H) to the adjacent unit pixels PX1a-PX4a.

The demodulation control signal may be applied to each unit pixel regardless of a voltage of the demodulation control signal applied to the adjacent unit pixels, such that the operation time of each unit pixel can be reduced.

The incident light (IL) having a phase difference (θ) with respect to the modulated light (ML) may be incident upon the substrate. For example, the incident light (IL) may have a high intensity (H) indicating a high level in the second period P2, the third period P3, the fourth period P4, the eighth period P8, the ninth period P9, and the tenth period P10.

Each of the first to fourth unit pixels PX1a-PX4a may capture photocharges generated by the incident light (IL) in a time period in which the demodulation control signals respectively applied to the first to fourth unit pixels PX1a-PX4a have the activation voltage (H).

The first unit pixel PX1a may capture photocharges generated by the incident light (IL) in the second period P2, the third period P3, the eighth period P8, and the ninth period P9.

The first demodulation control signal ($V_{cs1}$) applied to the first unit pixel PX1a may be configured in a manner that the activation voltage (H) and the deactivation voltage (L) are periodically repeated, such that the amount of photocharges that are captured by the first unit pixel PX1a in the second period P2 and the third period P3 may be identical to the amount of photocharges that are captured by the first unit pixel PX1a in the eighth period P8 and the ninth period P9. In this case, the photocharges captured by the first unit pixel PX1a in the second period P2 and the third period P3 may be defined as Q(0).

The second unit pixel PX2a may capture photocharges generated by the incident light (IL) in the fourth period P4 and the tenth period P10.

The second demodulation control signal ($V_{cs2}$) applied to the second unit pixel PX2a may be configured in a manner that the activation voltage (H) and the deactivation voltage (L) are periodically repeated, such that the amount of photocharges that are captured by the second unit pixel PX2a in the fourth period P4 may be identical to the amount of photocharges that are captured by the second unit pixel PX2a in the tenth period P10. In this case, the photocharges captured by the second unit pixel PX2a in the fourth period P4 may be defined as Q(π).

The third unit pixel PX3a may capture photocharges generated by the incident light (IL) in the third period P3, the fourth period P4, the ninth period P9, and the tenth period P10.

The third demodulation control signal ($V_{cs3}$) applied to the third unit pixel PX3$a$ may be configured in a manner that the activation voltage (H) and the deactivation voltage (L) are periodically repeated, such that the amount of photocharges that are captured by the third unit pixel PX3$a$ in the third period P3 and the fourth period P4 may be identical to the amount of photocharges that are captured by the third unit pixel PX3$a$ in the ninth period P9 and the tenth period P10. In this case, the photocharges captured by the third unit pixel PX3$a$ in each of the third period P3 and the fourth period P4 may be defined as Q($\pi$/2).

The fourth unit pixel PX4$a$ may capture photocharges generated by the incident light (IL) in the eighth period P8.

The photocharges captured by the fourth unit pixel PX4$a$ in the eighth period PR8 may be defined as Q($3\pi$/2).

The image sensing device ISD may perform the sensing operation and the distance information detection in units of four adjacent unit pixels (e.g., PX1$a$, PX2$a$, PX3$a$, and PX4$a$) included in a (2×2) matrix (e.g., a unit matrix MX1$a$).

Although the above-mentioned timing diagram shown in FIG. 5 is explained using the unit matrix MX1$a$ as an example, the four adjacent unit pixels included in the pixel array 30$a$ can perform substantially the same sensing operation and substantially the same distance information detection.

Each of the unit pixels (PXa) arranged in the pixel array 30$a$ may receive any one of the first to fourth demodulation control signals $V_{cs1}$-$V_{cs4}$. In addition, the four adjacent unit pixels (PX1$a$-PX4$a$) arranged in the pixel array 30$a$ may receive different demodulation control signals.

Each of the unit pixels (PX1$a$-PX4$a$) may output a pixel signal corresponding to photocharges that are applied to the floating diffusion region (e.g., FD1$a$) during a readout time indicating a signal detection time. The image processor (not shown) may acquire the distance from the image sensing device ISD to the target object 1 by processing the output pixel signal.

In other words, the image sensing device ISD may calculate a phase difference ($\theta$) using the detected photocharges Q(0), Q($\pi$/2), Q($\pi$), and Q($3\pi$/2).

The photocharges generated by incident light (IL) applied to the pixel array 30$a$ may be divisionally captured by four unit pixels (e.g., PX1$a$, PX2$a$, PX3$a$, and PX4$a$) in different ways according to the respective phases.

Each of the first demodulation control signal ($V_{cs1}$) for acquiring the photocharges Q(0), the second demodulation control signal ($V_{cs2}$) for acquiring the photocharges Q($\pi$), the third demodulation control signal ($V_{cs3}$) for acquiring the photocharges Q($\pi$/2), and the fourth demodulation control signal ($V_{cs4}$) for acquiring the photocharges Q($3\pi$/2) may have a phase difference of $\pi$/2(90°), the image processor (not shown) may receive image data corresponding to Q(0), image data corresponding to Q($\pi$), image data corresponding to Q($\pi$/2), and image data corresponding to Q($3\pi$/2) from the four adjacent unit pixels (e.g., PX1$a$, PX2$a$, PX3$a$, and PX4$a$), respectively. The image processor (not shown) may calculate a phase difference based on the image data and obtain a distance between the image sensing device ISD and the target object 1.

Figure 6:
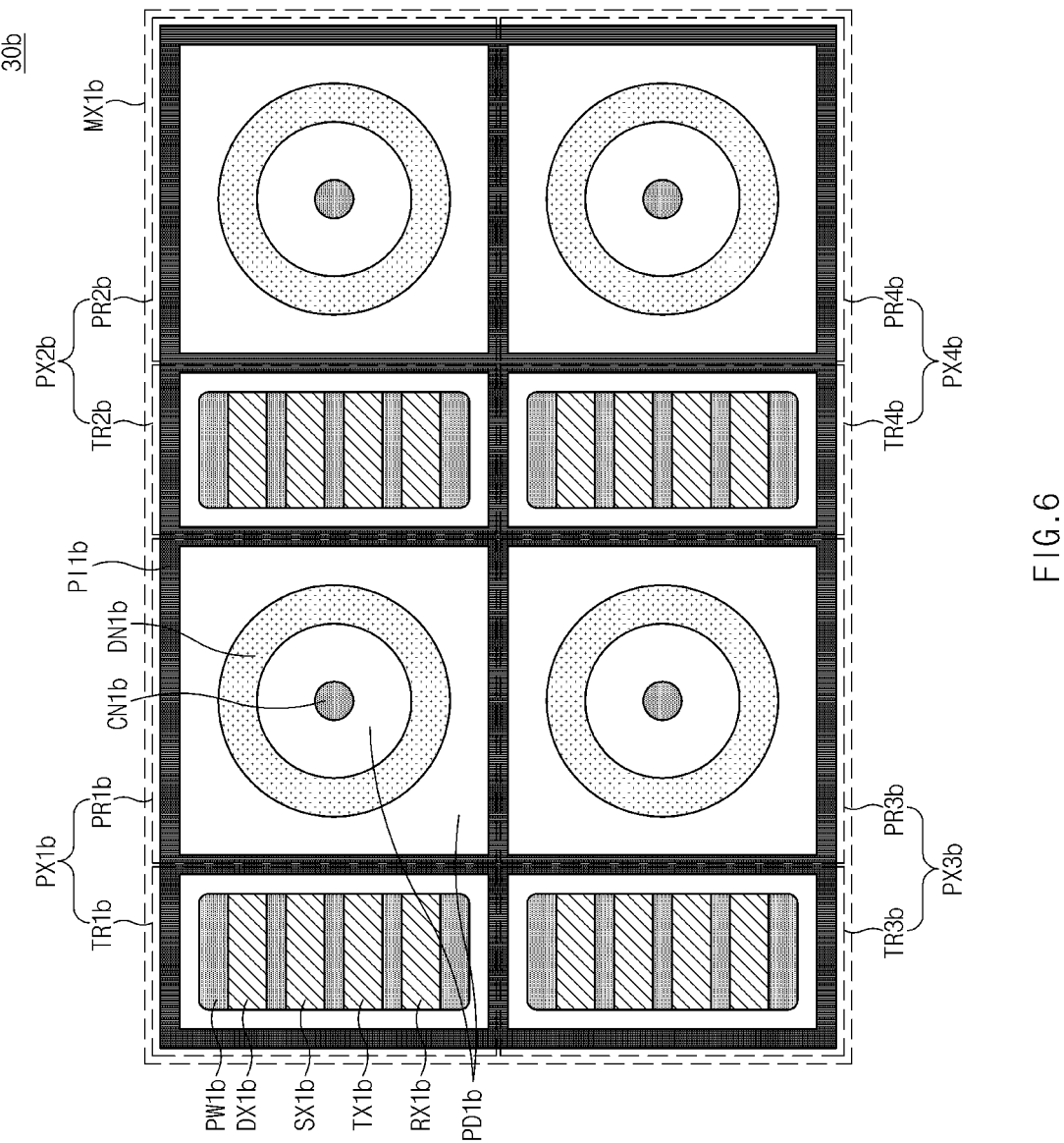
FIG. 6 is a schematic diagram illustrating another example of the pixel array shown in FIG. 1 based on some implementations of the disclosed technology.

FIG. 6 is a schematic diagram illustrating another example of a pixel array 30$b$ shown in FIG. 1 based on some implementations of the disclosed technology.

Although FIG. 6 illustrates the pixel array 30$b$ as including four unit pixels (PX1$b$-PX4$b$) for convenience of description, the disclosed technology is not limited thereto, and the pixel array 30$b$ may include more or less unit pixels than what is shown in FIG. 6.

FIG. 6 illustrates the layout of the unit pixels (PX1$b$-PX4$b$) and the shape of elements included in the unit pixels (PX1$b$-PX4$b$).

The unit matrix MX1$b$ included in the pixel array 30$b$ may include four unit pixels (PX1$b$-PX4$b$) arranged in a (2×2) matrix.

Since the unit pixels (PX1$b$-PX4$b$) are identical in structure to each other, the structure of the first unit pixel PX1$b$ will be discussed below as an example.

In contrast to the unit pixel (e.g., PX1$a$ of FIG. 2) described with reference to FIGS. 2 to 4, the unit pixel PX1$b$ based on some implementations of the disclosed technology may include a transistor isolation region formed to surround the well region PW1$b$ in the transistor region TR1$b$.

The transistor isolation region TI1$b$ may electrically and physically isolate the transistor region TR1$b$ including the plurality of transistors (DX1$b$, SX1$b$, TX1$b$, RX1$b$) from an adjacent transistor region (e.g., TR3$b$) or a light reception isolation region PR1$b$.

Like the light reception isolation region PI1$b$, the transistor isolation region TI1$b$ may have a trench structure extending from one surface of the semiconductor substrate toward the other surface opposite to the one surface of the substrate. In addition, the transistor isolation region TI1$b$ may have a structure including a plurality of layers.

For example, the transistor isolation region TI1$b$ may include an insulation layer including an insulating material such as silicon oxide, and the transistor region TR1$b$ may be physically and electrically isolated from adjacent regions by the insulation layer.

Also, the transistor isolation region TI1$b$ may include a reflection layer including a reflective material such as metal.

In some implementations, the reflection layer may include a metal material such as tungsten (W), and the insulation layer may include an insulating material such as silicon oxide.

The light reception isolation region PI1$b$ and the transistor isolation region TI1$b$ may be formed as one region through a trench etching process, an insulation layer deposition process, and a reflection layer deposition process. The light reception isolation region PI1$b$ and the transistor isolation region TI1$b$ may be collectively referred to as an isolation region.

Since the light reception isolation region PI1$b$ and the transistor isolation region TI1$b$ are included in the pixel array 30$b$, current leakage from the transistor region TR1$b$ to an adjacent region can be reduced.

Figure 7:
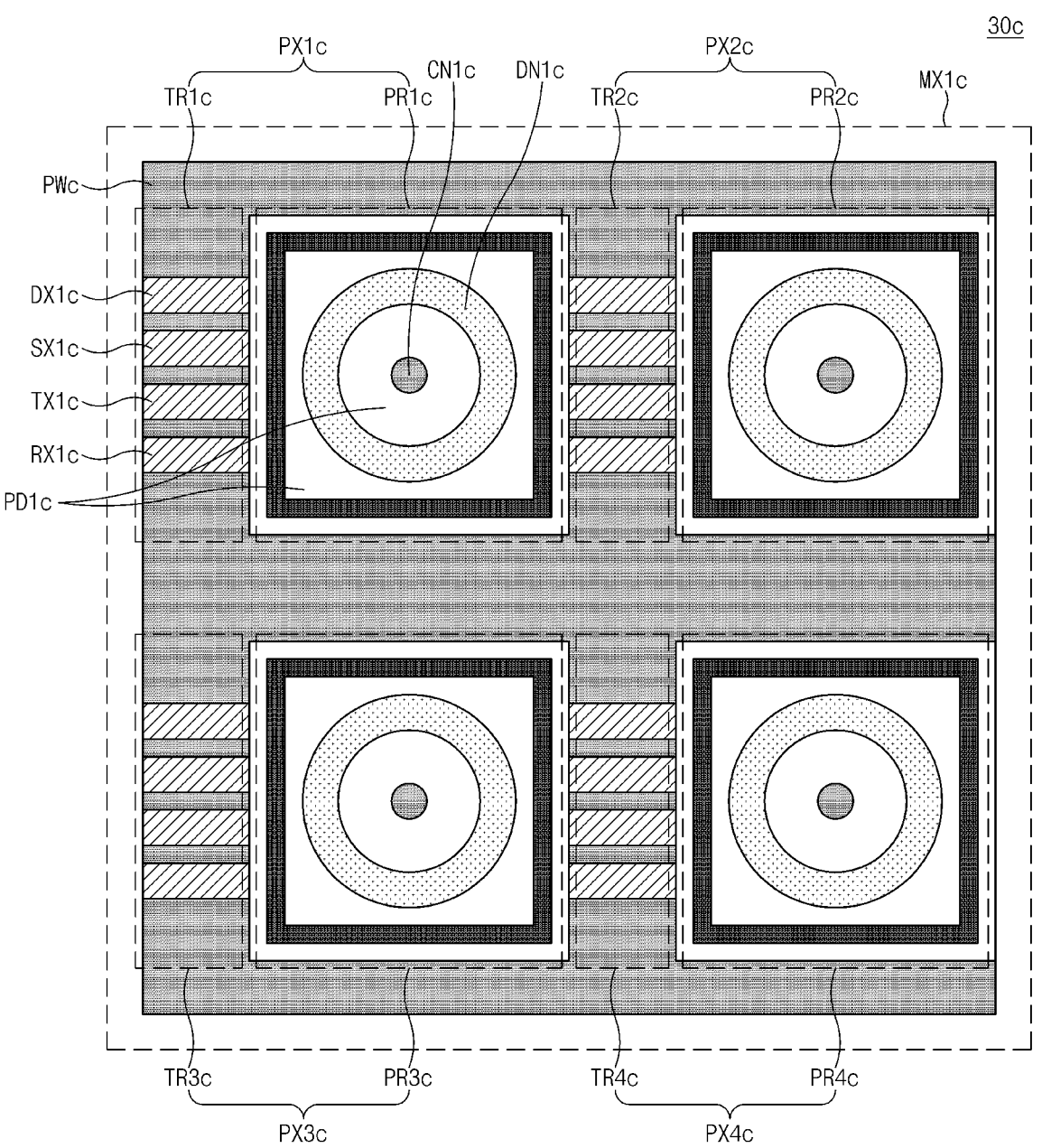
FIG. 7 is a schematic diagram illustrating still another example of the pixel array shown in FIG. 1 based on some implementations of the disclosed technology.

FIG. 7 is a schematic diagram illustrating still another example of a pixel array 30$c$ shown in FIG. 1 based on some implementations of the disclosed technology.

Although FIG. 7 illustrates the pixel array 30$c$ as including four unit pixels (PX1$c$-PX4$c$) for convenience of description, the disclosed technology is not limited thereto, and the pixel array 30$c$ may include an arbitrary number of unit pixels as necessary.

FIG. 7 illustrates the layout of the unit pixels (PX1$c$-PX4$c$) and the shape of elements included in the unit pixels (PX1$c$-PX4$c$), and as such redundant description thereof will herein be omitted for brevity.

The unit pixel MX1$c$ included in the pixel array 30$c$ may include four unit pixels PX1$c$ to PX4$c$ arranged in a (2×2) matrix.

Since the unit pixels (PX1$c$-PX4$c$) are identical in structure to each other, the structure of the first unit pixel PX1$c$ will be discussed below as an example.

The transistor region TR1$c$ included in the first unit pixel PX1$c$ may include at least a portion of the well region PWc doped with P-type impurities. The well region may be formed to surround the light reception region PR1$c$ included in the unit pixel PX1$c$, and may be a region to which the ground voltage ($V_{gnd}$) is applied.

The well region PWc may be a region connected throughout the pixel array 30$c$, and may be formed at one surface of a semiconductor substrate including the pixel array 30$c$. The well region PWc may be a region doped with a higher concentration than the semiconductor substrate, and may be doped with the same impurity type as the semiconductor substrate.

As the well region PWc is formed to surround the light reception region PR1$c$ over the entire pixel array 30$c$, photocharge movement between adjacent light reception regions (e.g., PR1$c$ and PR3$c$) can be prevented by the well region PWc.

Figure 8:
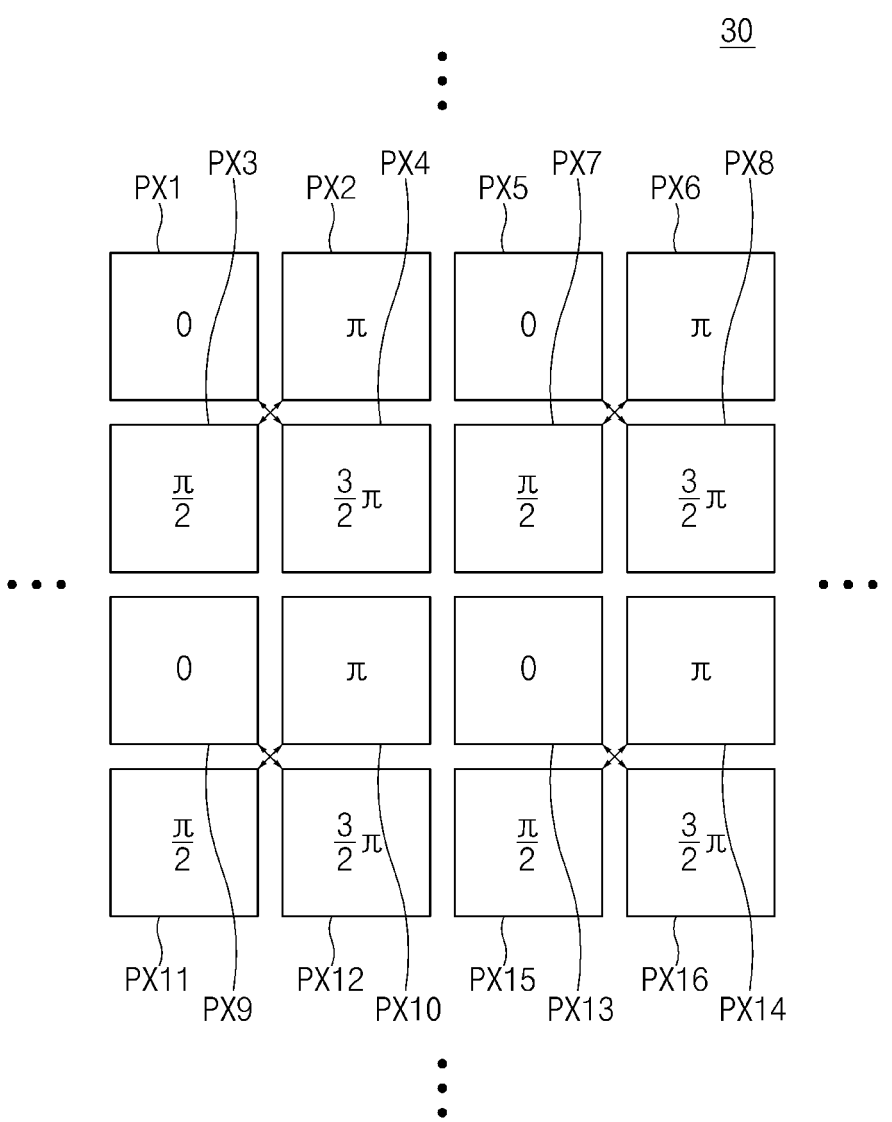
FIGS. 8 to 10 are schematic diagrams illustrating example methods for measuring a distance by an image sensing device based on some implementations of the disclosed technology.
Figure 9:
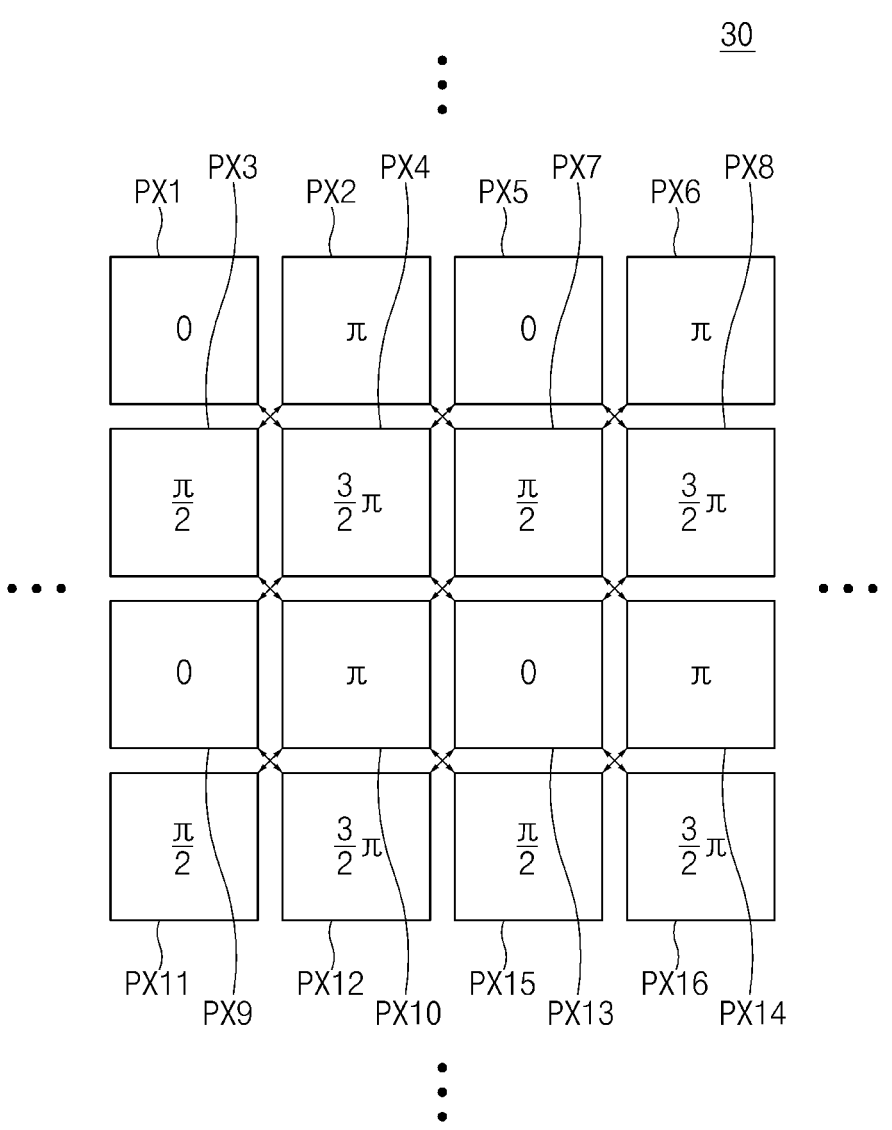
Figure 10:
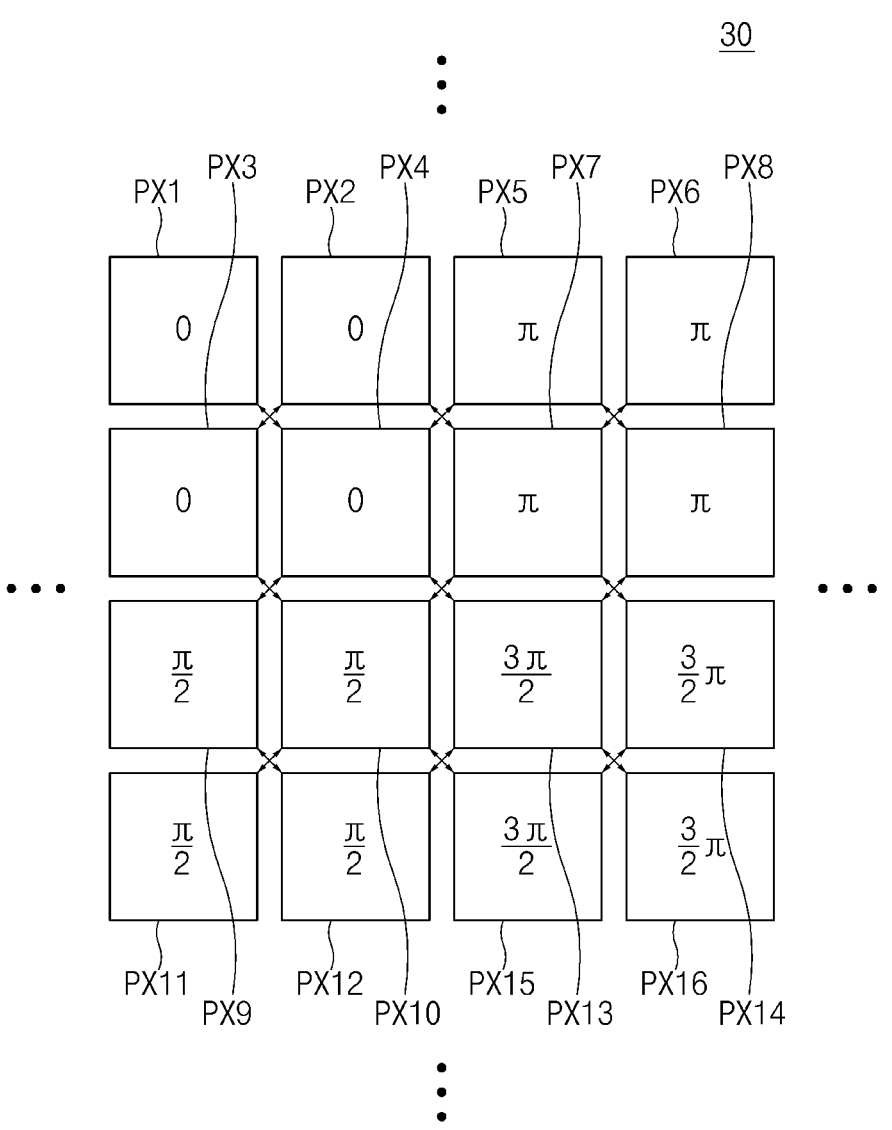

FIGS. 8 to 10 are schematic diagrams illustrating examples of a method for measuring the distance by the image sensing device based on some implementations of the disclosed technology.

For convenience of description, although the pixel array 30 shown in FIGS. 8 and 9 includes 16 unit pixels (PX1-PX16), the pixel array 30 may include more or less unit pixels than what is shown in FIGS. 8 and 9.

Each of the first unit pixel PX1, the fifth unit pixel PX5, the ninth unit pixel PX9, and the thirteenth unit pixel PX13 may receive a demodulation control signal (e.g., a first demodulation control signal $V_{cs1}$) having the same phase as the modulated light (ML).

Accordingly, each of the first unit pixel PX1, the fifth unit pixel PX5, the ninth unit pixel PX9, and the thirteenth unit pixel PX13 may generate a pixel signal corresponding to photocharges Q(0) corresponding to incident light (IL) received at a time point at which the first demodulation control signal ($V_{cs1}$) has an activation voltage.

Each of the second unit pixel PX2, the sixth unit pixel PX6, the tenth unit pixel PX10, and the fourteenth unit pixel PX14 may receive a demodulation control signal (e.g., a second demodulation control signal $V_{cs2}$) having a phase difference of n (180°) with respect to the modulated light (ML).

Accordingly, each of the second unit pixel PX2, the sixth unit pixel PX6, the tenth unit pixel PX10, and the fourteenth unit pixel PX14 may generate a pixel signal corresponding to photocharges Q($\pi$) corresponding to incident light (IL) received at a time point at which the second demodulation control signal ($V_{cs2}$) has an activation voltage.

Each of the third unit pixel PX3, the seventh unit pixel PX7, the eleventh unit pixel PX11, and the fifteenth unit pixel PX15 may receive a demodulation control signal (e.g., a third demodulation control signal $V_{cs3}$) having a phase difference of $\pi/2$ (90°) with respect to the modulated light (ML).

Accordingly, each of the third unit pixel PX3, the seventh unit pixel PX7, the eleventh unit pixel PX11, and the fifteenth unit pixel PX15 may generate a pixel signal corresponding to photocharges Q($\pi/2$) corresponding to incident light (IL) received at a time point at which the third demodulation control signal ($V_{cs3}$) has an activation voltage.

Each of the fourth unit pixel PX4, the eighth unit pixel PX3, the twelfth unit pixel PX12, and the sixteenth unit pixel PX16 may receive a demodulation control signal (e.g., a fourth demodulation control signal $V_{cs4}$) having a phase difference of 3$\pi$/2 (270°) with respect to the modulated light (ML).

Accordingly, each of the fourth unit pixel PX4, the eighth unit pixel PX8, the twelfth unit pixel PX12, and the sixteenth unit pixel PX16 may generate a pixel signal corresponding to photocharges Q(3$\pi$/2) corresponding to incident light (IL) received at a time point at which the fourth demodulation control signal ($V_{cs4}$) has an activation voltage.

The image processor (not shown) may use pixel signals generated from the first to fourth unit pixels (PX1-PX4) or may use other pixel signals generated from the fifth to eighth unit pixels (PX1-PX8) as shown in FIG. 8, and may obtain distance information between the image sensing device ISD and the target object 1 using the above pixel signals. In other words, the distance measurement method of FIG. 8 may obtain part of distance information from four unit pixels.

The image processor (not shown) may obtain distance information between the image sensing device ISD and the target object 1 using pixel signals output from four adjacent unit pixels, as shown in FIG. 9. For example, the distance measurement method of FIG. 9 may use pixel signals generated from the first to fourth unit pixels (PX1-PX4) or may use other pixel signals generated from the second unit pixel PX2, the fifth unit pixel PX5, the fourth unit pixel PX4, and the seventh unit pixel PX7, and may obtain distance information between the image sensing device ISD and the target object 1 using the above pixel signals. The distance measurement method of FIG. 9 can obtain part of distance information from one unit pixel.

FIG. 10 is a schematic diagram illustrating a distance measurement method using the image sensing device based on some other implementations of the disclosed technology.

Although FIG. 10 exemplarily illustrates that the pixel array 30 includes 16 unit pixels (PX1-PX16) for convenience of description, the scope or spirit of the disclosed technology is not limited thereto, and the pixel array 30 may include an arbitrary number of unit pixels as necessary.

Each of the first unit pixel PX1, the second unit pixel PX2, the third unit pixel PX3, and the fourth unit pixel PX4 may receive a demodulation control signal (e.g., a first demodulation control signal $V_{cs1}$) having the same phase as the modulated light (ML).

Accordingly, each of the first unit pixel PX1, the second unit pixel PX2, the third unit pixel PX3, and the fourth unit pixel PX4 may generate a pixel signal corresponding to photocharges Q(0), which correspond to incident light (IL) received at a time point at which the first demodulation control signal ($V_{cs1}$) has an activation voltage.

Each of the fifth unit pixel PX5, the sixth unit pixel PX6, the seventh unit pixel PX7, and the eighth unit pixel PX8 may receive a demodulation control signal (e.g., a second demodulation control signal $V_{cs2}$) having a phase difference of n (180°) with respect to the modulated light (ML).

Accordingly, each of the fifth unit pixel PX5, the sixth unit pixel PX6, the seventh unit pixel PX7, and the eighth unit pixel PX8 may generate a pixel signal corresponding to photocharges Q($\pi$), which correspond to incident light (IL) received at a time point at which the second demodulation control signal ($V_{cs2}$) has an activation voltage.

Each of the ninth unit pixel PX9, the tenth unit pixel PX10, the eleventh unit pixel PX11, and the twelfth unit pixel PX12 may receive a demodulation control signal (e.g., a third demodulation control signal $V_{cs3}$) having a phase difference of $\pi/2$ (90°) with respect to the modulated light (ML).

Accordingly, each of the ninth unit pixel PX9, the tenth unit pixel PX10, the eleventh unit pixel PX11, and the twelfth unit pixel PX12 may generate a pixel signal corresponding to photocharges Q($\pi/2$), which correspond to incident light (IL) received at a time point at which the third demodulation control signal ($V_{cs3}$) has an activation voltage.

Each of the thirteenth unit pixel PX13, the fourteenth unit pixel PX14, the fifteenth unit pixel PX15, and the sixteenth unit pixel PX16 may receive a demodulation control signal (e.g., a fourth demodulation control signal $V_{cs4}$) having a phase difference of) $3\pi/2$ ($270°$ with respect to the modulated light (ML).

Accordingly, each of the thirteenth unit pixel PX13, the fourteenth unit pixel PX14, the fifteenth unit pixel PX15, and the sixteenth unit pixel PX16 may generate a pixel signal corresponding to photocharges $Q(3\pi/2)$, which correspond to incident light (IL) received at a time point at which the fourth demodulation control signal ($V_{cs4}$) has an activation voltage.

Referring to FIG. 10, the image processor (not shown) may receive pixel signals output from the first to fourth unit pixels PX1 to PX4, and may calculate an average value of some pixel signals corresponding to incident light received at a time point at which the first demodulation control signal ($V_{cs1}$) has an activation voltage from among the received pixel signals.

The image processor (not shown) may correct noise of pixel signals output from the respective unit pixels upon receiving an average value of pixel signals output from the first to fourth unit pixels PX1 to PX4.

Similarly, the image processor (not shown) may receive, from the fifth to eighth unit pixels PX5 to PX8, pixel signals corresponding to incident light that has been received at a time point at which the second demodulation control signal ($V_{cs2}$) has an activation voltage, from the fifth to eighth unit pixels PX5 to PX8, and may calculate an average value of the received pixel signals.

The image processor (not shown) may correct noise of each pixel signal using the average value of the pixel signals, and may calculate a more accurate phase based on the corrected noise.

As described above, the image processor (not shown) may calculate an average value of pixel signals received from four adjacent unit pixels (e.g., first to fourth unit pixels), and may obtain information about the distance between the image sensing device ISD and the target object 1 based on the calculated average value.

In other words, the distance measurement method of FIG. 10 can obtain part of distance information from 16 unit pixels.

As is apparent from the above description, the image sensing device based on some implementations of the disclosed technology includes an isolation structure formed to surround a photoelectric conversion region included in a unit pixel, reducing or minimizing signal interferences between adjacent unit pixels and leakage current.

In addition, the image sensing device based on some implementations of the disclosed technology can enable each unit pixel to form a vertical electric field in the photoelectric conversion region, thereby improving photocharge transfer efficiency.

The embodiments of the disclosed technology may provide a variety of effects capable of being directly or indirectly recognized through the above-mentioned patent document.

Although a number of illustrative embodiments have been described, it should be understood that modifications and/or enhancements to the disclosed embodiments and other embodiments can be devised based on what is described and/or illustrated in this patent document.

What is claimed is:

1. An image sensing device comprising:
a substrate; and a plurality of unit pixels located in the substrate and configured to generate pixel signals by converting incident light from a target object into photocharge to indicate an image of the target object carried by the incident light and distance information between the image sensing device and the target object in response to a demodulation control signal for generating a current in the substrate, wherein each of the plurality of unit pixels includes:
a photoelectric conversion region formed in the substrate and configured to generate the photocharge by converting the incident light;
a control region disposed adjacent to the photoelectric conversion region in the substrate and extending to a first surface of the substrate and configured to receive the demodulation control signal;
a detection region disposed adjacent to the photoelectric conversion region and the control region in the substrate and configured to capture the photocharge moving by the generated current;
an isolation region structured to surround the photoelectric conversion region, the control region, and the detection region; and
a passivation region disposed on a second surface of the substrate opposite to the first surface of the substrate,
wherein the control region and the passivation region are arranged such that the generated current flows between the control region and the passivation region,
wherein the isolation region includes: a reflection layer configured to reflect the incident light; and an insulation layer in contact with the reflection layer.

2. The image sensing device according to claim 1, wherein:
the plurality of unit pixels is arranged in rows and columns in a pixel array; and
the isolation region surrounding the photoelectric conversion region, the control region, and the detection region is configured to block the photocharges from moving between adjacent unit pixels arranged in the pixel array.

3. The image sensing device according to claim 1, wherein:
the substrate and the unit pixels are configured to generate holes that form the generated current.

4. The image sensing device according to claim 1, wherein:
the demodulation control signal switches between an activation voltage and a deactivation voltage, wherein the activation voltage activates the detection region to generate the generated current, and the deactivation voltage deactivates the detection region.

5. The image sensing device according to claim 1, wherein:
the demodulation control signal is one of a first demodulation control signal, a second demodulation control signal, a third demodulation control signal, or a fourth demodulation control signal,
wherein:
the first demodulation control signal has a phase difference of 90 degrees with respect to the second demodulation control signal;
the second demodulation control signal has a phase difference of 90 degrees with respect to the third demodulation control signal;
the third demodulation control signal has a phase difference of 90 degrees with respect to the fourth demodulation control signal; and the fourth demodulation control signal has a phase difference of 90 degrees with respect to the first demodulation control signal.

6. The image sensing device according to claim 5, wherein:

the plurality of unit pixels includes four adjacent unit pixels arranged in a matrix array having two rows and two columns; and the demodulation control signals respectively applied to the four unit pixels are the first, second, third, and fourth demodulation control signals, respectively.

7. The image sensing device according to claim 1, wherein:

the detection region is configured to surround the control region; and the isolation region is configured to surround the detection region.

8. The image sensing device according to claim 1, wherein:

the passivation region is configured to receive a ground voltage as an input.

9. The image sensing device according to claim 1, wherein each of the plurality of unit pixels includes:

a transistor region including transistors for processing the pixel signal received from the detection region.

10. The image sensing device according to claim 9, wherein:

the isolation region is configured to isolate the photoelectric conversion region from the transistor region.

11. The image sensing device according to claim 1, wherein each of the plurality of unit pixels includes:

a well region located on the first surface of the substrate and adjacent to the isolation region.

12. The image sensing device according to claim 11, wherein:

the well region is configured to surround the isolation region.

13. The image sensing device according to claim 11, wherein:

the well region is configured to receive a ground voltage as an input.

14. An image sensing device comprising:

a substrate; and a plurality of unit pixels located in the substrate and configured to generate pixel signals by converting incident light from a target object into photocharge to indicate an image of the target object carried by the incident light and distance information between the image sensing device and the target object in response to a demodulation control signal for generating a current in the substrate, wherein each of the plurality of unit pixels includes:

a photoelectric conversion region formed in the substrate and configured to generate the photocharge by converting the incident light;

a control region disposed adjacent to the photoelectric conversion region in the substrate and extending to a first surface of the substrate and configured to receive the demodulation control signal;

a detection region disposed adjacent to the photoelectric conversion region and the control region in the substrate and configured to capture the photocharge moving by the generated current;

an isolation region structured to surround the photoelectric conversion region, the control region, and the detection region; and a passivation region disposed on a second surface of the substrate opposite to the first surface of the substrate, wherein the control region and the passivation region are arranged such that the generated current flows between the control region and the passivation region, wherein the isolation region is formed to extend from the first surface of the substrate to the second surface opposite to the first surface of the substrate.

15. An image sensing device comprising:

a plurality of unit pixels configured to generate pixel signals by converting incident light from a target object into photocharge to indicate an image of the target object and a distance between the image sensing device and the target object in response to a demodulation control signal for generating a current, wherein each of the plurality of unit pixels includes:

a light reception region configured to receive incident light and generate the pixel signal corresponding to the incident light; and a transistor region configured to process the pixel signal generated by the light reception region, wherein the light reception region includes:

a control region configured to generate the generated current;

a detection region configured to capture photocharge moving by the generated current and configured to output the pixel signal corresponding to the photocharge; and an isolation region structured to isolate the light reception region from another adjacent light reception region or the transistor region, wherein the isolation region includes: a reflection layer configured to reflect the incident light; and an insulation layer in contact with the reflection layer.

16. The image sensing device according to claim 15, wherein:

the control region is configured to receive the demodulation control signal as an input.

17. The image sensing device according to claim 15, further comprising:

a passivation region configured to receive a ground voltage as an input to direct the generated current to flow between the control region and the passivation region.

18. The image sensing device according to claim 15, wherein:

the unit pixels are structured so that the generated current is generated by holes that are generated upon receiving the demodulation control signal by the control region.

19. The image sensing device according to claim 15, wherein:

the demodulation control signal switches between an activation voltage and a deactivation voltage, wherein the activation voltage activates the detection region to generate the generated current, and the deactivation voltage deactivates the detection region by terminating the generated current.

* * * * *